United States Patent

Egi et al.

(10) Patent No.: US 8,624,254 B2
(45) Date of Patent: Jan. 7, 2014

(54) THIN FILM TRANSISTOR

(75) Inventors: Yuji Egi, Kanagawa (JP); Tetsuhiro Tanaka, Kanagawa (JP); Toshiyuki Isa, Kanagawa (JP); Hidekazu Miyairi, Kanagawa (JP); Koji Dairiki, Kanagawa (JP); Yoichi Kurosawa, Kanagawa (JP); Kunihiko Suzuki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 226 days.

(21) Appl. No.: 13/226,775

(22) Filed: Sep. 7, 2011

(65) Prior Publication Data

US 2012/0061676 A1   Mar. 15, 2012

(30) Foreign Application Priority Data

Sep. 14, 2010   (JP) ................. 2010-205992

(51) Int. Cl.
*H01L 29/04* (2006.01)
*H01L 29/786* (2006.01)

(52) U.S. Cl.
USPC ............... 257/60; 257/E29.003; 257/E29.273

(58) Field of Classification Search
USPC .............................. 257/60, E29.003, E29.273
See application file for complete search history.

(56) References Cited

U.S. PATENT DOCUMENTS

| | | |
|---|---|---|
| 4,409,134 A | 10/1983 | Yamazaki |
| 5,101,242 A | 3/1992 | Ikeda et al. |
| 5,221,631 A | 6/1993 | Ikeda et al. |
| 5,311,040 A | 5/1994 | Hiramatsu et al. |
| 5,453,858 A | 9/1995 | Yamazaki |
| 5,514,879 A | 5/1996 | Yamazaki |
| 5,591,987 A | 1/1997 | Yamazaki et al. |
| 5,600,154 A | 2/1997 | Shimizu et al. |
| 5,614,732 A | 3/1997 | Yamazaki |

(Continued)

FOREIGN PATENT DOCUMENTS

| | | |
|---|---|---|
| EP | 0 535 979 A2 | 4/1993 |
| JP | 05-7071126 | 5/1982 |

(Continued)

OTHER PUBLICATIONS

Kim. C et al, "42.1: A Novel Four-Mask-Count Process Architecture for TFT-LCDS" SID Digest '00: SID International Symposium Digest of Technical Papers, vol. 31 , pp. 1006-1009, 2000.

(Continued)

*Primary Examiner* — Matthew W Such
*Assistant Examiner* — Monica D Harrison
(74) *Attorney, Agent, or Firm* — Nixon Peabody LLP; Jeffrey L. Costellia

(57) ABSTRACT

A highly reliable transistor in which change in electrical characteristics is suppressed is provided. A highly reliable transistor in which change in electrical characteristics is suppressed is manufactured with high productivity. A display device with less image deterioration over time is provided. An inverted staggered thin film transistor which includes, between a gate insulating film and impurity semiconductor films functioning as source and drain regions, a semiconductor stacked body including a microcrystalline semiconductor region and a pair of amorphous semiconductor regions. In the microcrystalline semiconductor region, the nitrogen concentration on the gate insulating film side is low and the nitrogen concentration in a region in contact with the amorphous semiconductor is high. Further, an interface with the amorphous semiconductor has unevenness.

24 Claims, 19 Drawing Sheets

(56) References Cited

U.S. PATENT DOCUMENTS

| | | | |
|---|---|---|---|
| 5,648,662 | A | 7/1997 | Zhang et al. |
| 5,677,236 | A | 10/1997 | Saitoh et al. |
| 5,701,167 | A | 12/1997 | Yamazaki |
| 5,766,989 | A | 6/1998 | Maegawa et al. |
| 5,849,601 | A | 12/1998 | Yamazaki |
| 5,859,445 | A | 1/1999 | Yamazaki |
| 5,864,150 | A | 1/1999 | Lin |
| 5,932,302 | A | 8/1999 | Yamazaki et al. |
| 6,011,277 | A | 1/2000 | Yamazaki |
| 6,017,781 | A | 1/2000 | Shimizu et al. |
| 6,023,075 | A | 2/2000 | Yamazaki |
| 6,153,893 | A | 11/2000 | Inoue et al. |
| 6,171,674 | B1 | 1/2001 | Yamazaki et al. |
| 6,183,816 | B1 | 2/2001 | Yamazaki et al. |
| 6,188,085 | B1 | 2/2001 | Shimizu et al. |
| 6,246,070 | B1 | 6/2001 | Yamazaki et al. |
| 6,252,249 | B1 | 6/2001 | Yamazaki |
| 6,255,146 | B1 | 7/2001 | Shimizu et al. |
| 6,281,520 | B1 | 8/2001 | Yamazaki |
| 6,306,213 | B1 | 10/2001 | Yamazaki |
| 6,410,372 | B2 | 6/2002 | Flewitt |
| 6,468,617 | B1 | 10/2002 | Yamazaki et al. |
| 6,468,839 | B2 | 10/2002 | Inoue et al. |
| 6,483,124 | B2 | 11/2002 | Flewitt |
| 6,737,676 | B2 | 5/2004 | Yamazaki |
| 6,750,086 | B2 | 6/2004 | Jinno et al. |
| 6,756,258 | B2 | 6/2004 | Zhang et al. |
| 6,835,523 | B1 | 12/2004 | Yamazaki et al. |
| 7,045,818 | B2 | 5/2006 | Jinno et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,199,846 | B2 | 4/2007 | Lim |
| 7,432,906 | B2 | 10/2008 | Nakajima et al. |
| 7,442,592 | B2 | 10/2008 | Ichijo et al. |
| 7,511,709 | B2 | 3/2009 | Koyama et al. |
| 7,551,655 | B2 | 6/2009 | Tanaka et al. |
| 7,554,117 | B2 | 6/2009 | Nakamura |
| 7,576,360 | B2 | 8/2009 | Yamazaki |
| 8,017,946 | B2 | 9/2011 | Yamazaki et al. |
| 8,395,156 | B2 | 3/2013 | Miyairi et al. |
| 8,395,158 | B2 | 3/2013 | Yamazaki et al. |
| 2002/0009819 | A1 | 1/2002 | Flewitt |
| 2004/0221809 | A1 | 11/2004 | Ohmi et al. |
| 2005/0012097 | A1 | 1/2005 | Yamazaki |
| 2005/0022864 | A1 | 2/2005 | Fujioka et al. |
| 2008/0299689 | A1 | 12/2008 | Yamazaki |
| 2009/0033818 | A1 | 2/2009 | Nakajima et al. |
| 2009/0057683 | A1 | 3/2009 | Nakajima et al. |
| 2009/0061574 | A1 | 3/2009 | Nakajima et al. |
| 2009/0114921 | A1 | 5/2009 | Yamazaki et al. |
| 2009/0321737 | A1 | 12/2009 | Isa et al. |
| 2009/0321743 | A1 | 12/2009 | Isa et al. |
| 2010/0059749 | A1* | 3/2010 | Takahashi et al. ............ 257/57 |
| 2010/0096637 | A1 | 4/2010 | Yamazaki et al. |
| 2010/0148177 | A1 | 6/2010 | Koyama et al. |
| 2010/0224879 | A1 | 9/2010 | Miyairi et al. |
| 2011/0147754 | A1 | 6/2011 | Isa et al. |

FOREIGN PATENT DOCUMENTS

| | | |
|---|---|---|
| JP | 57-071126 | 5/1982 |
| JP | 58-092217 | 6/1983 |
| JP | 59-072781 | 4/1984 |
| JP | 02-053941 | 11/1990 |
| JP | 04-242724 | 8/1992 |
| JP | 04-266019 | 9/1992 |
| JP | 06-326312 | 11/1994 |
| JP | 11-121761 | 4/1999 |
| JP | 2000-277439 | 10/2000 |
| JP | 2001-007024 | 1/2001 |
| JP | 2001-217424 | 8/2001 |
| JP | 2004-014958 | 1/2004 |
| JP | 2005-049832 | 2/2005 |
| JP | 2005-167051 | 6/2005 |
| JP | 2008-124392 | 5/2008 |
| JP | 2010-109341 | 5/2010 |
| JP | 2010-123925 | 6/2010 |
| JP | 2010-123926 | 6/2010 |

OTHER PUBLICATIONS

Arai. T et al, "41.2: Micro Silicon Technology for Active Matrix OLED Display", SID Digest '07: SID International Symposium Digest of Technical Papers, vol. 38, pp. 1370-1373, 2007.

Fujiwara. H et al, "Stress-Induced Nucleation of Microcrystalline Silicon from Amorphous Phase", Japanese Journal of Applied Physics, vol. 41, No. 5A, pp. 2821-2828, May 15, 2002.

Kamei. T et al., "A Significant Reduction of Impurity Contents in Hydrogenated Microcrystalline Silicon Films for Increased Grain Size and Reduced Defect Density", Japanese Journal of Applied Physics, vol. 37, No. 3A, pp. L265-L268, Mar. 1, 1998.

Lee. C et al. "Directly Deposited Nanocrystalline Silicon Thin-Film Transistors With Ultra High Mobilities", Applied Physics Letters, vol. 89, No. 25, pp. 252101-1-252101-3, Dec. 18, 2006.

Song. J et al, "34.1: Advanced Four-Mask Process Architecture for the A-SI TFT Array Manufacturing Method", SID Digest '02: SID International Symposium Digest of Technical Papers, vol. 32, pp. 1038-1041, 2002.

Choi. S et al., "P-16: Novel Four-Mask Process in the FFS TFT-LCD With Optimum Multiple-Slit Design Applied by the Use of a Gray-Tone Mask", SID Digest '05: SID International Symposium Digest of Technical Papers, vol. 36, pp. 284-287, 2005.

Lee. C et al., "High-Mobility Nanocrystalline Silicon Thin-Film Transistors Fabricated by Plasma-Enhanced Chemical Vapor Deposition", Applied Physics Letters), vol. 86, pp. 222106-1-222106-3, May 24, 2005.

Lee. C et al., "High-Mobility N-Channel and P-Channel Nanocrystalline Silicon Thin-Film Transistors", IEDM 05: Technical Digest of International Electron Devices Meeting, pp. 937-940, 2005.

Lee. C et al., "How to Achieve High Mobility Thin Film Transistors by Direct Deposition of Silicon Using 13.56 MHZ RF PECVD?", IEDM 06: Technical Digest of International Electron Devices Meeting, pp. 295-298, Dec. 11, 2006.

Esmaeili-Rad. M et al., "High Stability, Low Leakage Nanocrystalline Silicon Bottom Gate Thin Film Transistors for AMOLED Displays", IEDM 06: Technical Digest of International Electron Devices Meeting, pp. 303-306, 2006.

Lee. H et al. "Leakage Current Mechanisms in Top-Gate Nanocrystalline Silicon Thin-Film Transistors", Applied Physics Letters, vol. 92, pp. 083509-1-083509-3, Feb. 28, 2008.

Lee. C et al., "Stability of nc-SiH TFTS With Silicon Nitride Gate Dielectric", IEEE Transactions on Electron Devices, vol. 54, No. 1, pp. 45-51, 2007.

Sazonov. A et al. "Low-Temperature Materials and Thin Film Transistors for Flexible Electronics", Proceedings of the IEEE, vol. 93, No. 8, pp. 1420-1428, Aug. 1, 2005.

Lee. C et al. "Top-Gate TFTS Using 13.56 MHz PECVD Microcrystalline Silicon", IEEE Electron Device Letters, vol. 26, No. 9, pp. 637-639, Sep. 5, 2005.

Lee. C et al., "Postdeposition Thermal Annealing and Material Stability of 75° C. Hydrogenated Nanocrystalline Silicon Plasma-Enhanced Chemical Vapor Deposition Films", Journal of Applied Physics, vol. 98, No. 3, pp. 034305-1-034305-7, Aug. 4, 2005.

Fujiwara. H et al., "Microcrystalline silicon nucleation sites in the sub-surface of hydrogenated amorphous silicon", Surface Science, vol. 497, No. 1-3, pp. 333-340, 2002.

Fujiwara. H et al. "Real-time spectroscopic ellipsometry studies of the nucleation and grain growth processes in microcrystalline silicon thin films", Physical Review. B, vol. 63, pp. 115306-1-115306-9, Feb. 23, 2001.

(56) References Cited

OTHER PUBLICATIONS

Esmaeili-Rad. M et al. "Absence of Defect State Creation in Nanocrystalline Silicon Thin-Film Transistors Deduced From Constant Current Stress Measurements", Applied Physics Letters, vol. 91, No. 11, pp. 113511-1-113511-3, Sep. 12, 2007.

Esmaeili-Rad. M et al. "Stability of Nanocrystalline Silicon Bottom-Gate Thin-Film Transistors With Silicon Nitride Gate Dielectric", Journal of Applied Physics, vol. 102, No. 6, pp. 064512-1-064512-7, Sep. 28, 2007.

Cho. Y et al. "Characteristics of a-Si:H Dual-Gate TFTS Using Ito Electrode for LCD Driver", AM-FPD '08 Digest of Technical Papers, pp. 229-232, Jul. 2, 2008.

* cited by examiner

THIN FILM TRANSISTOR

BACKGROUND OF THE INVENTION

1. Field of the Invention

The present invention relates to a thin film transistor, a manufacturing method thereof, and a display device.

2. Description of the Related Art

As one type of field-effect transistor, a thin film transistor whose channel region is formed using a semiconductor film which is formed over a substrate having an insulating surface is known. Techniques in which amorphous silicon, microcrystalline silicon, or polycrystalline silicon is used for the semiconductor film where the channel region is formed in the thin film transistor have been disclosed. Further, a thin film transistor is disclosed which includes, between a gate insulating layer formed over a gate electrode and source and drain regions, a microcrystalline semiconductor layer and a pair of buffer layers formed over the microcrystalline semiconductor layer and formed of an amorphous semiconductor (see Patent Document 1). A typical application of such a thin film transistor is a liquid crystal television device, in which the thin film transistor has been used as a switching transistor in each pixel in a display screen.

REFERENCE

Patent Document

[Patent Document 1] Japanese Published Patent Application No. 2010-123925

SUMMARY OF THE INVENTION

A thin film transistor whose channel region is formed using an amorphous or microcrystalline silicon film can be manufactured by a smaller number of steps as compared to a thin film transistor whose channel region is formed using a polycrystalline silicon film, and can be manufactured over a large-sized substrate, which can lead a reduction in manufacturing costs. However, such a thin film transistor whose channel region is formed using the amorphous or microcrystalline silicon film has a problem in that electrical characteristics thereof change depending on temperature or operating time to lower the reliability.

In view of the above, an object of one embodiment of the present invention is to provide a highly reliable transistor in which change in electrical characteristics is suppressed. An object of one embodiment of the present invention is to provide a method for manufacturing a highly reliable transistor in which change in electrical characteristics is suppressed with high productivity. An object of one embodiment of the present invention is to provide a display device with less image deterioration over time.

One embodiment of the present invention is an inverted staggered thin film transistor which includes, between a gate insulating film and impurity semiconductor films functioning as source and drain regions, a semiconductor stacked body including a microcrystalline semiconductor region and a pair of amorphous semiconductor regions. In the microcrystalline semiconductor region, the nitrogen concentration on the gate insulating film side is low and the nitrogen concentration in a region in contact with the amorphous semiconductor region is high. Further, an interface between the microcrystalline semiconductor region and the amorphous semiconductor region has unevenness.

One embodiment of the present invention is an inverted staggered thin film transistor which includes the following: a gate electrode; a gate insulating film; impurity semiconductor films functioning as source and drain regions; a semiconductor stacked body provided between the gate insulating film and the impurity semiconductor films; a wiring in contact with the impurity semiconductor films; an insulating film covering the semiconductor stacked body and the wiring; and a back gate electrode formed over the insulating film. The semiconductor stacked body includes a microcrystalline semiconductor region and a pair of amorphous semiconductor regions. In the microcrystalline semiconductor region, the nitrogen concentrations on the gate insulating film side and the insulating film side are low and the nitrogen concentration in a region in contact with the amorphous semiconductor region is high. Further, an interface between the microcrystalline semiconductor region and the amorphous semiconductor region has unevenness.

One embodiment of the present invention is an inverted staggered thin film transistor which includes, between a gate insulating film and impurity semiconductor films functioning as source and drain regions, a semiconductor stacked body including a microcrystalline semiconductor region and a pair of amorphous semiconductor regions. In the microcrystalline semiconductor region which is in contact with the amorphous semiconductor region, a nitrogen concentration profile by secondary ion mass spectrometry is low on the gate insulating film side and marks a peak concentration on the amorphous semiconductor region side. In the microcrystalline semiconductor region which is not in contact with the amorphous semiconductor region, a nitrogen concentration profile by secondary ion mass spectrometry marks no peak concentration.

One embodiment of the present invention is an inverted staggered thin film transistor which includes, between a gate insulating film and impurity semiconductor films functioning as source and drain regions, a semiconductor stacked body including a microcrystalline semiconductor region and a pair of amorphous semiconductor regions. In the microcrystalline semiconductor region which is in contact with the amorphous semiconductor region, a nitrogen concentration profile by secondary ion mass spectrometry is low on the gate insulating film side, increases toward the amorphous semiconductor region, and has the maximum value in the microcrystalline semiconductor region and the amorphous semiconductor region. In the microcrystalline semiconductor region which is not in contact with the amorphous semiconductor region, a nitrogen concentration profile by secondary ion mass spectrometry marks no peak concentration.

The nitrogen concentration is low in a region of the microcrystalline region on the gate insulating film side; thus, defects in that region can be reduced. As a result, the thin film transistor can have improved reliability. Further, an uneven region containing nitrogen is included in the microcrystalline semiconductor regions which overlap with the impurity semiconductor films functioning as the source and drain regions. Thus, resistance in the vertical direction (the film thickness direction) of when voltage is applied between source and drain electrodes in an on state can be lowered. Accordingly, change in the electrical characteristics of the thin film transistor can be reduced while on-state current and field-effect mobility thereof are increased.

According to one embodiment of the present invention, the reliability of a thin film transistor can be improved. Further, a highly reliable thin film transistor in which change in electrical characteristics is suppressed can be manufactured with

DETAILED DESCRIPTION OF THE INVENTION

Figure 1A:
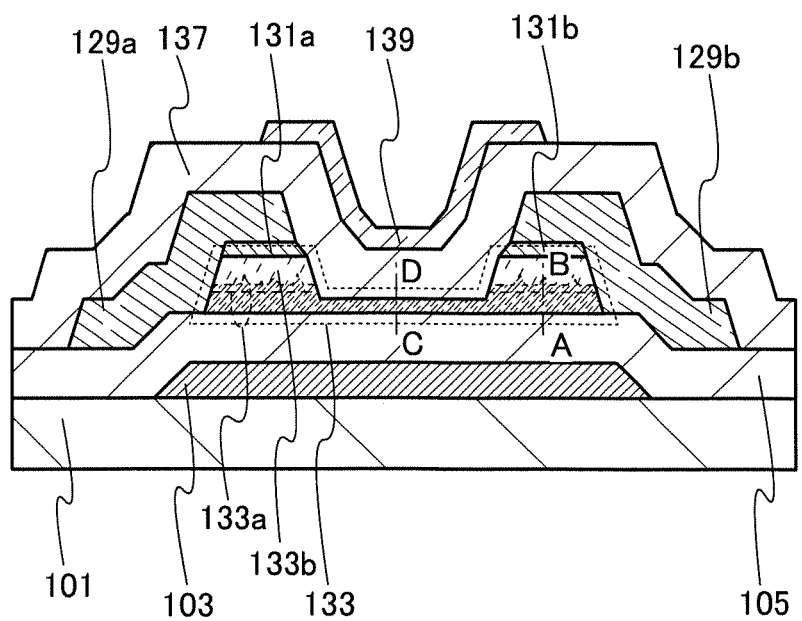
FIGS. 1A and 1B are cross-sectional views each illustrating a structure of a thin film transistor according to one embodiment of the present invention.

Hereinafter, embodiments and examples of the present invention will be described with reference to the drawings. Note that the present invention is not limited to the following description. The present invention can be implemented in various different ways and it will be readily appreciated by those skilled in the art that various changes and modifications are possible without departing from the spirit and the scope of the present invention. Therefore, the present invention should not be construed as being limited to the following description of the embodiments and examples. Note that reference numerals denoting the same portions are commonly used in different drawings in describing the structure of the present invention.

Embodiment 1

In this embodiment, a highly reliable thin film transistor and a manufacturing method thereof are described.

Figure 1B:
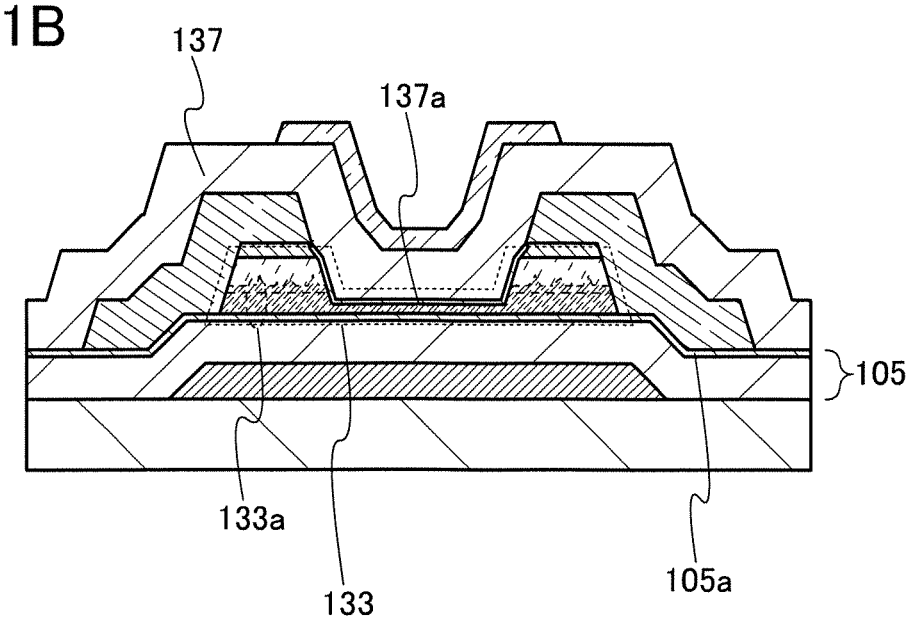

FIGS. 1A and 1B are cross-sectional views each illustrating a thin film transistor described in this embodiment.

A thin film transistor illustrated in FIG. 1A includes, over a substrate 101, a gate electrode 103 (also referred to as a first gate electrode), a semiconductor stacked body 133, a gate insulating film 105 (also referred to as a first gate insulating film) provided between the gate electrode 103 and the semiconductor stacked body 133, impurity semiconductor films 131a and 131b which are in contact with the semiconductor stacked body 133 and function as source and drain regions, and wirings 129a and 129b which are in contact with the impurity semiconductor films 131a and 131b. An insulating film 137 (also called a second gate insulating film) covering the gate insulating film 105, the semiconductor stacked body 133, the impurity semiconductor films 131a and 131b, and the wirings 129a and 129b is formed. A back gate electrode 139 (also referred to as a second gate electrode) may be provided over the insulating film 137.

The semiconductor stacked body 133 includes a microcrystalline semiconductor region 133a and a pair of amorphous semiconductor regions 133b. The microcrystalline semiconductor region 133a has a surface which is in contact with the gate insulating film 105 (hereinafter, referred to as a first surface) and a surface which faces the first surface and is in contact with the pair of amorphous semiconductor regions 133b and the insulating film 137 (hereinafter, referred to as a second surface). The amorphous semiconductor region 133b has a surface which is in contact with the microcrystalline semiconductor region 133a (hereinafter, referred to as a first surface) and a surface which faces the first surface and is in contact with the impurity semiconductor films 131a and 131b (hereinafter, referred to as a second surface). A region of the microcrystalline semiconductor region 133a which is not covered with the pair of amorphous semiconductor regions 133b has a concave portion. That region of the microcrystalline semiconductor region 133a functions as a channel region.

Note that a microcrystalline semiconductor is a semiconductor having an intermediate structure between an amorphous structure and a crystalline structure (including a single crystal structure and a polycrystalline structure). A microcrystalline semiconductor is a semiconductor having a third state that is stable in terms of free energy and is a crystalline semiconductor having short-range order and lattice distortion, in which column-like or needle-like mixed phase grains having a mixed phase grain size greater than or equal to 2 nm and less than or equal to 200 nm, preferably greater than or equal to 10 nm and less than or equal to 80 nm, more preferably greater than or equal to 20 nm and less than or equal to 50 nm grow in a direction normal to the substrate surface. Therefore, there is a case in which a grain boundary is formed at the interface between the column-like or needle-like mixed phase grains. Note that the mixed phase grain size means the maximum diameter of mixed phase grains in a plane parallel to the substrate surface. Further, the mixed phase grain includes an amorphous silicon region and a crystallite that is a small crystal regarded as a single crystal. In some cases, the mixed phase grain may include a twin crystal.

The Raman spectrum of microcrystalline silicon, which is a typical example of a microcrystalline semiconductor, is located in a lower wave number side than 520 $cm^{-1}$, which represents single crystal silicon. That is, the peak of the Raman spectrum of the microcrystalline silicon exists between 520 cm$^{-1}$ which represents single crystal silicon and 480 cm$^{-1}$ which represents amorphous silicon. In addition, microcrystalline silicon includes hydrogen or halogen at 1 at. % or more in order to terminate dangling bonds. Moreover, microcrystalline silicon has increased stability and is preferable when containing a rare gas element such as helium, neon, argon, krypton, or xenon to further enhance lattice distortion. Such a description of the microcrystalline semiconductor is disclosed in, for example, U.S. Pat. No. 4,409,134.

Figure 2D:
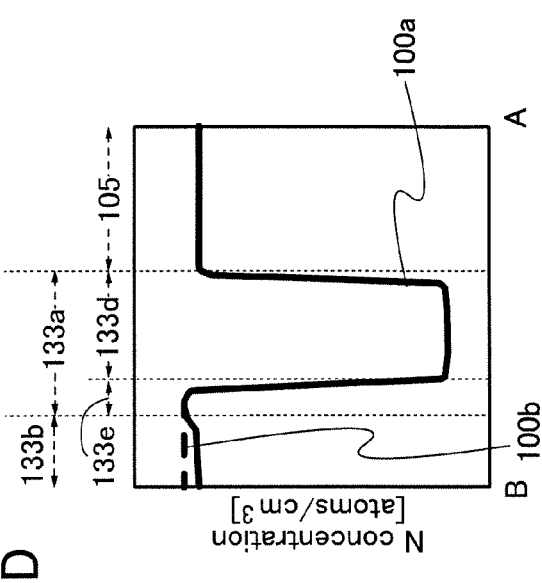
FIGS. 2A to 2E are views illustrating structures of thin film transistors according to one embodiment of the present invention.
Figure 2E:
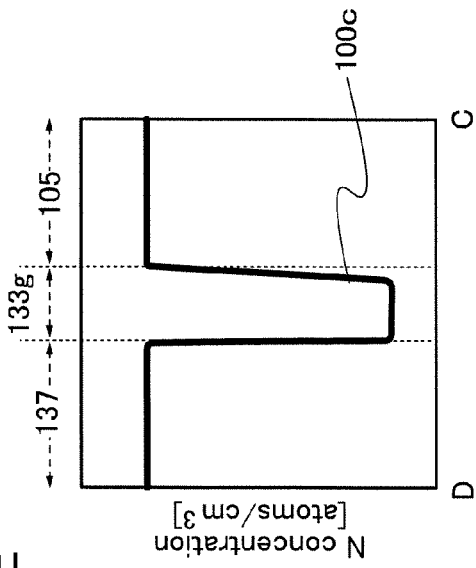
Figure 2A:
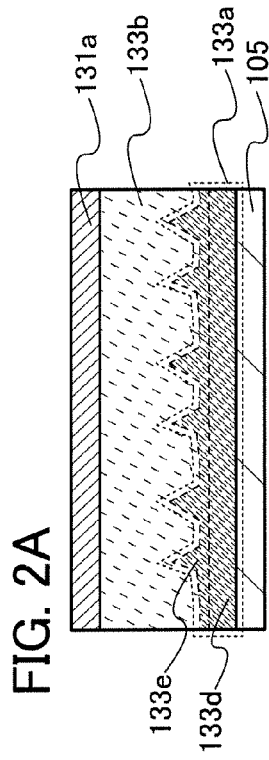
Figure 2B:
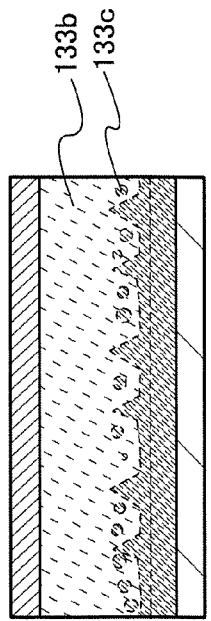
Figure 2C:
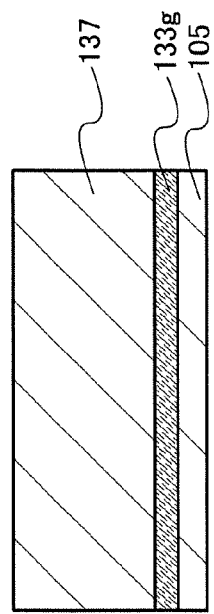

FIGS. 2A and 2B are enlarged views of a cross-section along a dashed-and-dotted line A-B between the gate insulating film 105 and the impurity semiconductor film 131a illustrated in FIG. 1A, and FIG. 2C is an enlarged view of a cross-section along a dashed-and-dotted line C-D between the gate insulating film 105 and the insulating film 137 illustrated in FIG. 1A.

As illustrated in FIG. 2A, the microcrystalline semiconductor region 133a includes a microcrystalline semiconductor region 133d and a microcrystalline semiconductor region 133e. In the microcrystalline semiconductor region 133d, the nitrogen concentration is low. The concentration of nitrogen contained in the microcrystalline semiconductor region 133d which is measured by secondary ion mass spectrometry (SIMS) is higher than or equal to the minimum limit of detection and lower than or equal to $1 \times 10^{19}$ atoms/cm$^3$, whereby the crystallinity of the microcrystalline semiconductor region 133d and the reliability of the thin film transistor can be improved.

A straight dashed line indicated between the microcrystalline semiconductor region 133d and the microcrystalline semiconductor region 133e denotes an interface between the regions for convenience; actually, the interface between the microcrystalline semiconductor region 133d and the microcrystalline semiconductor region 133e is unclear.

The microcrystalline semiconductor region 133e included in the microcrystalline semiconductor region 133a has a sharp projection and/or a sharp depression; the projection has a conical or pyramidal shape whose width decreases from the gate insulating film 105 side toward the amorphous semiconductor region 133b (a tip of the projection has an acute angle). Note that the microcrystalline semiconductor region 133e may have a projection whose width increases from the gate insulating film 105 side toward the amorphous semiconductor region 133b (an inverted conical or pyramidal shape).

In the microcrystalline semiconductor region 133e, the nitrogen concentration is high. A NH group or an NH$_2$ group may be contained in a crystal grain boundary included in the microcrystalline semiconductor region 133e and an interface between the microcrystalline semiconductor region 133e and the amorphous semiconductor region 133b. When the concentration of nitrogen contained in the microcrystalline semiconductor region 133e which is measured by SIMS is higher than or equal to $1 \times 10^{20}$ atoms/cm$^3$ and lower than or equal to $1 \times 10^{21}$ atoms/cm$^3$, preferably higher than or equal to $2 \times 10^{20}$ atoms/cm$^3$ and lower than or equal to $1 \times 10^{21}$ atoms/cm$^3$, it is possible to form the microcrystalline semiconductor region 133e having a conical or pyramidal shape or an inverted conical or pyramidal shape and to reduce resistance in the vertical direction (the film thickness direction) of when voltage is applied between the source and drain electrodes of the thin film transistor in an on state, i.e., the resistance of the semiconductor stacked body 133 can be lowered. Accordingly, the on-state current and the field-effect mobility of the thin film transistor can be increased.

Note that the term "on-state current" refers to current which flows between a source electrode and a drain electrode when a thin film transistor is on. For example, in the case of an n-channel thin film transistor, the on-state current refers to current which flows between a source electrode and a drain electrode when gate voltage is higher than the threshold voltage of the transistor.

In addition, the term "off-state current" refers to current which flows between a source electrode and a drain electrode when a thin film transistor is off. For example, in the case of an n-channel thin film transistor, the off-state current refers to current which flows between a source electrode and a drain electrode when gate voltage is lower than the threshold voltage of the thin film transistor.

When the thickness of the microcrystalline semiconductor region 133a, that is, the distance from the interface between the microcrystalline semiconductor region 133a and the gate insulating film 105 to the tip of the projection of the microcrystalline semiconductor region 133a is greater than or equal to 5 nm and less than or equal to 310 nm, the off-state current of the thin film transistor can be reduced.

Further, it is preferable that the concentration of oxygen contained in the microcrystalline semiconductor region 133a which is measured by secondary ion mass spectrometry be less than $1 \times 10^{18}$ atoms/cm$^3$, because such an oxygen concentration can improve the crystallinity of the microcrystalline semiconductor region 133a.

The amorphous semiconductor region 133b is formed of an amorphous semiconductor containing nitrogen. Nitrogen in the amorphous semiconductor containing nitrogen may exist, for example, as an NH group or an NH$_2$ group. Amorphous silicon is used as an amorphous semiconductor.

The amorphous semiconductor containing nitrogen is a semiconductor having lower energy at an Urbach edge measured by a constant photocurrent method (CPM) or photoluminescence spectrometry and a smaller amount of absorption spectra of defective levels as compared to a conventional amorphous semiconductor. In other words, as compared to the conventional amorphous semiconductor, the amorphous silicon containing nitrogen is a well-ordered semiconductor having fewer defects and a steep tail of a level at a band edge in the valence band. Since the amorphous semiconductor containing nitrogen has a steep tail of a level at a band edge in the valence band, the band gap is wide and tunnel current does not flow easily. Thus, when the amorphous semiconductor containing nitrogen is provided between the microcrystalline semiconductor region 133a and the impurity semiconductor film 131a, the off-state current of the thin film transistor can be reduced. In addition, by providing the amorphous semiconductor containing nitrogen, the on-state current and the field-effect mobility can be increased.

Further, a peak of a spectrum of the amorphous semiconductor containing nitrogen obtained by low-temperature photoluminescence spectrometry is greater than or equal to 1.31 eV and less than or equal to 1.39 eV. Note that a peak of a spectrum of a microcrystalline semiconductor, typically microcrystalline silicon, obtained by low-temperature photoluminescence spectrometry is greater than or equal to 0.98 eV and less than or equal to 1.02 eV, which shows that an amorphous semiconductor containing nitrogen is different from a microcrystalline semiconductor.

Further, as illustrated in FIG. 2B, a semiconductor mixed phase grain 133c whose grain size is greater than or equal to 1 nm and less than or equal to 10 nm, preferably greater than or equal to 1 nm and less than or equal to 5 nm is included in the amorphous semiconductor region 133b, whereby the on-state current and the filed-effect mobility of the thin film transistor can be further increased.

A microcrystalline semiconductor having a projection shape (a conical or pyramidal shape) whose width decreases from the gate insulating film 105 side toward the amorphous semiconductor region 133b is formed in the following manner. After the microcrystalline semiconductor region 133d is formed under a condition where a microcrystalline semiconductor is deposited, crystal growth is caused under a condition where crystal growth is suppressed, so that the microcrystalline semiconductor region 133e is formed, and the amorphous semiconductor region 133b is deposited.

Here, a nitrogen concentration profile between the gate insulating film 105 and the pair of amorphous semiconductor regions 133b, which is measured by SIMS, is described with reference to FIG. 2D. Note that a silicon nitride film is used as the gate insulating film 105, a microcrystalline silicon region is used as the microcrystalline semiconductor region 133a, and an amorphous silicon region containing nitrogen is used as the amorphous semiconductor region 133b.

FIG. 2D is a schematic diagram of a nitrogen concentration profile measured by SIMS along a dashed-and-dotted line A-B in FIG. 1A, in which the vertical axis indicates the nitrogen concentration and the horizontal axis indicates a distance between A and B. A solid line 100a denotes the nitrogen concentration profile of the gate insulating film 105, the microcrystalline semiconductor region 133a, and the amorphous semiconductor region 133b.

In the gate insulating film 105 side of the microcrystalline semiconductor region 133a, that is, the microcrystalline semiconductor region 133d, the nitrogen concentration is low; thus, the nitrogen concentration profile drastically decreases from the interface between the gate insulating film 105 and the microcrystalline semiconductor region 133d toward the microcrystalline semiconductor region 133d, and does not mark a peak concentration (the maximum value). On the other hand, the microcrystalline semiconductor region 133e provided on the pair of amorphous semiconductor regions 133b side contains nitrogen; thus, the nitrogen concentration increases from the microcrystalline semiconductor region 133d toward the amorphous semiconductor region 133b and then decreases a little. That is, the nitrogen concentration profile marks a peak concentration (the maximum value) in the microcrystalline semiconductor region 133e.

Note that in the amorphous semiconductor region 133b, there are a case where, as denoted by the solid line 100a, the concentration is constant at a concentration lower than the peak concentration of the microcrystalline semiconductor region 133e, and a case where, as denoted by a dashed line 100b, the nitrogen concentration is substantially constant in the amorphous semiconductor region 133b and the concentration is the largest value in the semiconductor stacked body 133 (the microcrystalline semiconductor region 133a and the amorphous semiconductor region 133b).

Next, a region between the gate insulating film 105 and the insulating film 137, which is to be a channel region, is described with reference to FIG. 2C.

In a microcrystalline semiconductor region 133g provided between the gate insulating film 105 and the insulating film 137, the nitrogen concentration is low. Note that the microcrystalline semiconductor region 133g is part of the microcrystalline semiconductor region 133d. Thus, when the nitrogen concentration of the microcrystalline semiconductor region 133g is higher than or equal to the minimum limit of detection and lower than or equal to $1 \times 10^{19}$ atoms/cm$^3$ similarly to the microcrystalline semiconductor region 133d, the crystallinity of the microcrystalline semiconductor region 133g and the reliability of the thin film transistor can be improved.

Here, a nitrogen concentration profile between the gate insulating film 105 and the insulating film 137 is described with reference to FIG. 2E. Note that a silicon nitride film is used as the gate insulating film 105, a microcrystalline silicon region 133g is used as the microcrystalline semiconductor region, and a silicon nitride film is used as the insulating film 137.

FIG. 2E is a schematic diagram of a nitrogen concentration profile measured by SIMS along a dashed-and-dotted line C-D in FIG. 1A, in which the vertical axis indicates the nitrogen concentration and the horizontal axis indicates a distance between C and D. A solid line 100c denotes the nitrogen concentration profile of the gate insulating film 105, the microcrystalline semiconductor region 133g, and the insulating film 137.

In the gate insulating film 105 side of the microcrystalline semiconductor region 133g, the nitrogen concentration is low; thus, similarly to the nitrogen concentration profile denoted by the solid line 100a, the nitrogen concentration profile drastically decreases from the interface between the gate insulating film 105 and the microcrystalline semiconductor region 133g toward the microcrystalline semiconductor region 133g. Further, the microcrystalline semiconductor region 133e containing nitrogen as is illustrated in FIG. 2D is not included in the microcrystalline semiconductor region 133g, and thus the nitrogen concentration profile does not mark a peak concentration. Moreover, the nitrogen concentration profile does not increase so much from the microcrystalline semiconductor region 133g toward the interface between the microcrystalline semiconductor region 133g and the insulating film 137.

Although the nitrogen concentration profiles in the microcrystalline semiconductor regions 133d and 133g mark constant concentrations in FIGS. 2D and 2E, the concentrations may increase or decrease depending on the deposition conditions in some cases. However, the nitrogen concentration profile does not mark a peak concentration in the microcrystalline semiconductor regions 133d and 133g.

Further, in the nitrogen concentration profile, there may be a tail from the gate insulating film 105, the amorphous semiconductor region 133b, and the insulating film 137 to the microcrystalline semiconductor regions 133d and 133g due to a knock-on effect, in some cases.

Further, since the silicon nitride films are used as the gate insulating film 105 and the insulating film 137 in this embodiment, the nitrogen concentration is higher in the gate insulating film 105 and the insulating film 137 than in the microcrystalline semiconductor regions 133d and 133g in the profile. On the other hand, when oxide insulating films are used as the gate insulating film 105 and the insulating film 137, the nitrogen concentration is low and the nitrogen concentration profile thus does not drastically decreases from the gate insulating film 105 to the microcrystalline semiconductor regions 133d and 133g; moreover, the nitrogen concentration profile does not drastically increase from the microcrystalline semiconductor region 133g to the insulating film 137.

The nitrogen concentration is low in regions of the microcrystalline semiconductor region 133g to be the channel region, which are on the gate insulating film 105 side and the insulating film 137 side; thus, defects in those regions can be reduced. Thus, the thin film transistor can have improved reliability. Further, the microcrystalline semiconductor region 133e having a conical or pyramidal shape or an inverted conical or pyramidal shape and containing nitrogen is included in the microcrystalline semiconductor regions which overlap with the impurity semiconductor films functioning as the source and drain regions. Thus, resistance in the vertical direction (the film thickness direction) of when voltage is applied between the source and drain electrodes in an on state, i.e., the resistance of the semiconductor stacked body 133 can be lowered. Further, tunnel current does not easily flow and the off-state current can be reduced because the amorphous semiconductor region containing nitrogen which is a well-ordered semiconductor having fewer defects and a steep tail of a level at a band edge in the valence band is provided between the microcrystalline semiconductor region 133e and the impurity semiconductor film 131a. Accordingly, in the thin film transistor described in this embodiment, the on-state current and field-effect mobility are high, the off-state current is low, and change in the electrical characteristics is suppressed.

Next, other details of the thin film transistor are described.

As the substrate 101, a glass substrate, a ceramic substrate, a plastic substrate which has high heat resistance enough to withstand process temperature of this manufacturing process, or the like can be used. In the case where the substrate does not need a light-transmitting property, a metal substrate, such as a stainless steel substrate, provided with an insulating film on its surface may be used. As the glass substrate, for example, an alkali-free glass substrate of barium borosilicate glass, aluminoborosilicate glass, aluminosilicate glass, or the like may be used. Note that there is no limitation on the size of the substrate 101. For example, any of glass substrates of the 3rd to 10th generations which are often used in the field of flat panel displays such as the above liquid crystal television devices can be used.

The gate electrode 103 can be formed as a single layer or a stacked layer using a metal material such as molybdenum, titanium, chromium, tantalum, tungsten, aluminum, copper, neodymium, scandium, or nickel or an alloy material which includes any of these materials as a main component. Further, a semiconductor typified by polycrystalline silicon doped with an impurity element such as phosphorus, an Ag—Pd—Cu alloy, an Al—Nd alloy, an Al—Ni alloy, or the like may be used.

For example, the following is a preferable two-layer structure of the gate electrode 103: a two-layer structure in which a molybdenum film is provided over an aluminum film, a two-layer structure in which a molybdenum film is provided over a copper film, a two-layer structure in which a titanium nitride film or a tantalum nitride film is provided over a copper film, a two-layer structure in which a titanium nitride film and a molybdenum film are stacked, a two-layer structure in which a film of a copper-magnesium alloy containing oxygen and a copper film are stacked, a two-layer structure in which a film of a copper-manganese alloy containing oxygen and a copper film are stacked, a two-layer structure in which a copper-manganese alloy film and a copper film are stacked, or the like. As a three-layer structure, it is preferable to stack a tungsten film or a tungsten nitride film, an alloy film of aluminum and silicon or an alloy film of aluminum and titanium, and a titanium nitride film or a titanium film. By stacking a metal film serving as a barrier film over a film having low electric resistance, electric resistance can be low and diffusion of metal elements from the metal film into the semiconductor film can be prevented.

The gate insulating film 105 can be formed as a single layer or a stacked layer using a silicon oxide film, a silicon oxynitride film, a silicon nitride film, a silicon nitride oxide film, an aluminum oxide film, an aluminum nitride film, an aluminum oxynitride film, or an aluminum nitride oxide film. Note that when the gate insulating film 105 is provided with an oxide insulating film 105a that is formed of a silicon oxide film, an aluminum oxide film, or the like and is in contact with the semiconductor stacked body 133 as illustrated in FIG. 1B, the nitrogen concentration in the interface with the semiconductor stacked body 133 can be reduced and thus the reliability of the thin film transistor can be improved.

Further, as described in Embodiment 3, a surface of the gate insulating film 105 may be subjected to oxygen plasma treatment, so that an oxide insulating film is formed on the surface of the gate insulating film 105. Examples of the oxidizing gas used for the oxygen plasma treatment include oxygen, ozone, dinitrogen monoxide, water vapor, and a mixed gas of oxygen and hydrogen.

Note that here, silicon oxynitride contains more oxygen than nitrogen. In the case where measurements are performed using Rutherford backscattering spectrometry (RBS) and hydrogen forward scattering spectrometry (HFS), silicon oxynitride preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen. In the case where measurements are performed using RBS and HFS, silicon nitride oxide preferably contains oxygen, nitrogen, silicon, and hydrogen at 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The impurity semiconductor films 131a and 131b are formed of amorphous silicon to which phosphorus is added, microcrystalline silicon to which phosphorus is added, or the like in the case of an n-channel thin film transistor. Alternatively, the impurity semiconductor films 131a and 131b can have a stacked structure of amorphous silicon to which phosphorus is added and microcrystalline silicon to which phosphorus is added. Note that, in the case of a p-channel thin film transistor, the impurity semiconductor films 131a and 131b are formed of microcrystalline silicon to which boron is added, amorphous silicon to which boron is added, or the like. In the case where the semiconductor stacked body 133 forms an ohmic contact with the wirings 129a and 129b, the impurity semiconductor films 131a and 131b are not necessarily formed.

The wirings 129a and 129b can be formed as a single layer or a stacked layer using any of aluminum, copper, titanium, neodymium, scandium, molybdenum, chromium, tantalum, tungsten, and the like. An aluminum alloy to which an element for preventing a hillock is added (e.g., an Al—Nd alloy which can be used for the gate electrode 103) may also be used. Crystalline silicon to which an impurity element which serves as a donor is added may be used. A stacked-layer structure in which a film on the side that is in contact with the crystalline silicon to which an impurity element serving as a donor is added is formed of titanium, tantalum, molybdenum, tungsten, or a nitride of any of these elements, and a layer of aluminum or an aluminum alloy is formed thereover may also be formed. The wirings 129a and 129b may also have a stacked-layer structure where aluminum or an aluminum alloy is provided and titanium, tantalum, molybdenum, tungsten, or a nitride of any of these elements is provided thereon and thereunder.

The insulating film 137 can be formed using a material similar to the material for the gate insulating film 105 as appropriate. Note that as illustrated in FIG. 1B, in the case where the insulating film 137 has a stacked-layer structure, a layer that is in contact with the semiconductor stacked body 133 is preferably formed of an oxide insulating film 137a that is a silicon oxide film, an aluminum oxide film, or the like. This is because a region of the semiconductor stacked body 133, which is in contact with the insulating film 137, functions as a channel region in the case where a back gate electrode is provided over the insulating film 137, and the reliability of the thin film transistor can be improved by reducing the nitrogen concentration of the channel region.

The back gate electrode 139 can be formed using the material for the wirings 129a and 129b as appropriate. The back gate electrode 139 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added, or graphen.

In the thin film transistor described in this embodiment, the nitrogen concentration is low in the microcrystalline semiconductor region which is to be the channel region. Accordingly, defects in the channel region can be reduced and thus the reliability of the thin film transistor can be improved.

Next, a method for manufacturing a thin film transistor will be described with reference to FIGS. 3A to 3C, FIGS. 4A and 4B, FIGS. 5A to 5C, and FIGS. 6A to 6D. FIGS. 3A to 3C, and FIGS. 5A to 5C are cross-sectional views of the thin film transistor during the manufacturing process. Note that an n-channel thin film transistor has higher carrier mobility than a p-channel thin film transistor. Further, it is preferable that all thin film transistors formed over the same substrate have the same polarity because the number of manufacturing steps can be reduced in such a case. In this embodiment, a method for manufacturing n-channel thin film transistors will be described.

Figure 3A:
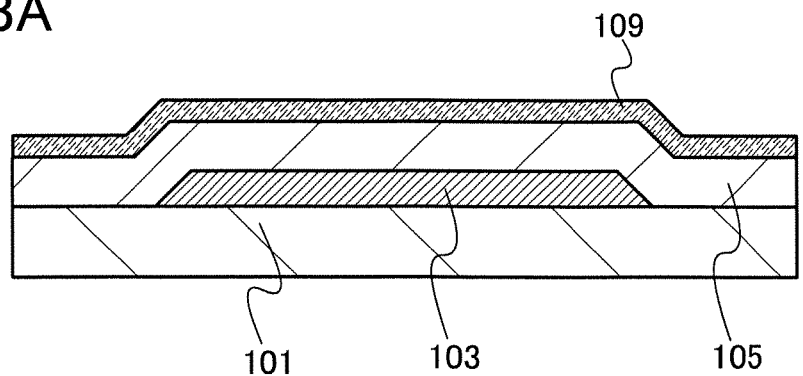
FIGS. 3A to 3C are cross-sectional views illustrating a method for manufacturing the thin film transistor according to one embodiment of the present invention.

As illustrated in FIG. 3A, a gate electrode 103 is formed over a substrate 101. Then, a gate insulating film 105 which covers the gate electrode 103 (also referred to as a first gate electrode) is formed. A microcrystalline semiconductor film 109 is formed over the gate insulating film 105.

The gate electrode 103 can be formed in the following manner: a conductive film is formed over the substrate 101 by a sputtering method or a vacuum evaporation method using any of the above materials; a mask is formed over the conductive film by a photolithography method, an inkjet method, or the like; and the conductive film is etched using the mask. Alternatively, the gate electrode 103 can be formed by discharging a conductive nanopaste of silver, gold, copper, or the like over the substrate by an inkjet method and baking the conductive nanopaste. In order to improve adhesion between the gate electrode 103 and the substrate 101, a nitride insulating film formed of any of the above metal materials may be provided between the substrate 101 and the gate electrode 103. In this embodiment, a conductive film is formed over the substrate 101 and etched using a resist mask formed by a photolithography process.

Note that the gate electrode 103 is preferably tapered. This is because an insulating film, a semiconductor film, and a wiring formed over the gate electrode 103 in later steps can be prevented from being broken at a step portion of the gate electrode 103. In order to form the tapered gate electrode 103, etching may be performed while the resist mask is made to recede.

In the step of forming the gate electrode 103, a gate wiring (a scan line) and a capacitor wiring can also be formed at the same time. The scan line refers to a wiring for selecting a pixel, and the capacitor wiring refers to a wiring which is connected to one of electrodes of a storage capacitor in a pixel. However, without limitation thereto, the gate electrode 103 and one of or both the gate wiring and the capacitor wiring may be formed separately.

Figure 4A:
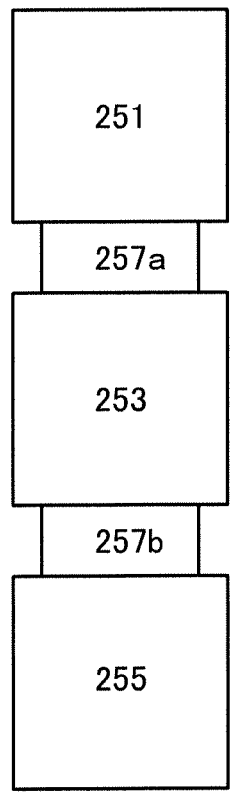
FIGS. 4A and 4B are a schematic diagram of a CVD apparatus and a flow chart illustrating a method for manufacturing a thin film transistor according to one embodiment of the present invention, respectively.
Figure 4B:
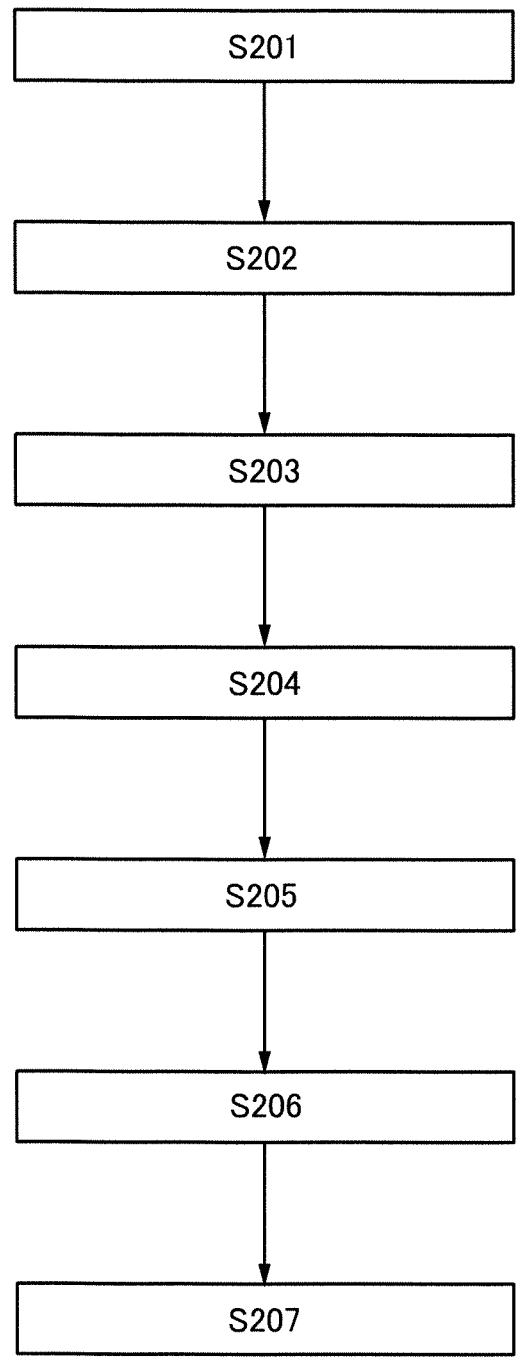

Here, a process from and including a step for depositing the gate insulating film 105 to and including a step for depositing the microcrystalline semiconductor film 109 is described with reference with FIGS. 4A and 4B. FIG. 4A is a schematic diagram of a CVD apparatus and FIG. 4B is a flow chart illustrating a process from and including a step for depositing the gate insulating film to and including a step for depositing the microcrystalline semiconductor film.

As illustrated in FIG. 4A, the CVD apparatus includes a load lock chamber 251, a transfer chamber 253, and a process chamber 255. A gate valve 257a is provided between the load lock chamber 251 and the transfer chamber 253, and a gate valve 257b is provided between the transfer chamber 253 and the process chamber 255. Each of the gate valves can be set to a predetermined pressure.

The substrate 101 with the gate electrode 103 is set in a cassette of the load lock chamber 251 of the CVD apparatus. Then, the gate valve 257a is opened, the substrate is moved from the cassette to the transfer chamber 253, and then the gate valve 257a is closed.

Subsequently, the gate valve 257b is opened and then the substrate is transferred to the process chamber 255 (S201 in FIG. 4B). After that, the gate valve 257b is closed. Then, the gate insulating film 105 is formed over the substrate 101 and the gate electrode 103 (S202 in FIG. 4B).

The gate insulating film 105 can be formed by a CVD method, a sputtering method, or the like. When the gate insulating film 105 is formed, glow discharge plasma is generated by application of high-frequency power with a frequency of 3 MHz to 30 MHz, typically 13.56 MHz or 27.12 MHz in the HF band, or high-frequency power with a frequency of approximately 30 MHz to 300 MHz in the VHF band, typically 60 MHz. Alternatively, glow discharge plasma is generated by application of high-frequency power with a microwave of 1 GHz or higher. Note that pulsed oscillation in which high-frequency power is applied in a pulsed manner or continuous oscillation in which high-frequency power is applied continuously can be employed. In addition, by superimposing high-frequency power in the HF band and high-frequency power in the VHF band on each other, unevenness of plasma across a large-sized substrate is also reduced, so that uniformity can be improved and the deposition rate can be increased. When the gate insulating film 105 is formed at a high frequency of 1 GHz or more with a microwave plasma CVD apparatus, the breakdown voltage between the gate electrode and the drain and source electrodes can be improved, whereby a highly reliable thin film transistor can be obtained.

Further, by forming a silicon oxide film by a CVD method using an organosilane gas as the gate insulating film 105, the crystallinity of the semiconductor film which is formed later can be improved, whereby the on-state current and the field-effect mobility of the thin film transistor can be increased. Examples of the organosilane gas include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

Subsequently, the gate valve 257b is opened and then the substrate is transferred to the transfer chamber 253 (S203 in FIG. 4B). After that, the gate valve 257b is closed.

After that, the inside of the process chamber 255 is cleaned (S204 in FIG. 4B). The inside of the process chamber 255 is cleaned in such a manner that a fluorine-based gas such as $CF_4$, $NF_3$, $F_2$, or the like is introduced into the process chamber 255 and glow discharge plasma is generated, whereby the gate insulating film attached to the inner wall of the process chamber 255 is etched by a highly reactive fluorine radical. Alternatively, the gate insulating film attached to the inner wall of the process chamber 255 can be removed by filling the process chamber 255 with highly reactive $ClF_3$. Accordingly, the impurity concentration and nitrogen concentration in the process chamber 255 can be reduced.

Then, a protective film is formed on the inner wall of the process chamber 255 (S205 in FIG. 4B). It is preferable that a film formed of an element that does not serve as an impurity in a microcrystalline semiconductor film be formed as the protective film; typically, an amorphous silicon film, a microcrystalline silicon film, or the like is formed. By formation of the protective film on the inner wall of the process chamber 255, mixture of a component of the process chamber or the gas used for cleaning into the microcrystalline semiconductor film can be suppressed.

Subsequently, the gate valve 257b is opened and then the substrate is transferred to the process chamber 255 (S206 in FIG. 4B). After that, the gate valve 257b is closed. Then, the microcrystalline semiconductor film 109 is formed over the gate insulating film 105 (S207 in FIG. 4B).

By providing the step of cleaning the inside of the process chamber and the step of forming the protective film between the formation step of the gate insulating film 105 and the formation step of the microcrystalline semiconductor film 109 as illustrated in FIG. 4B, mixture of impurities into the microcrystalline semiconductor film 109 can be suppressed. Especially when a nitride insulating film is used for the gate insulating film 105 and the microcrystalline semiconductor film 109 is formed in the process chamber 255 in which the nitride insulating film remains, the nitride insulating film is exposed to the plasma and nitrogen floats in the process chamber 255. When the microcrystalline semiconductor film is formed under that condition, the nitrogen is mixed into the microcrystalline semiconductor film 109. On the other hand, in the case where cleaning of the inside of the process chamber 255 and formation of the protective film on the inner wall of the process chamber 255 are performed after the substrate is transferred from the process chamber 255 to the transfer chamber 253, the nitrogen concentration of the microcrystalline semiconductor film 109 can be reduced.

The microcrystalline semiconductor film 109 is formed in a reaction chamber of a plasma CVD apparatus by glow discharge plasma using a mixture of hydrogen and a deposition gas containing silicon or germanium. Alternatively, the microcrystalline semiconductor film 109 may be formed by glow discharge plasma using a mixture of hydrogen, a deposition gas containing silicon or germanium, and a rare gas such as helium, neon, argon, krypton, or xenon. Here, microcrystalline silicon, microcrystalline silicon-germanium, or the like is formed under a condition where the deposition gas containing silicon or germanium is diluted with hydrogen whose flow rate is greater than or equal to 50 times and less than or equal to 1000 times that of the deposition gas. The deposition temperature is preferably room temperature to 350° C., more preferably 150° C. to 280° C. The distance between the upper electrode and the lower electrode is set to a distance which allows generation of plasma.

Typical examples of the deposition gas containing silicon or germanium include $SiH_4$, $Si_2H_6$, $GeH_4$, and $Ge_2H_6$.

When a rare gas such as helium, neon, argon, krypton, or xenon is added to a source gas of the microcrystalline semiconductor film 109, the deposition rate of the microcrystalline semiconductor film 109 can be increased. When the deposition rate is increased, the amount of impurities mixed into the microcrystalline semiconductor film 109 can be reduced. Accordingly, the crystallinity of the microcrystalline semiconductor film 109 can be improved. By using a rare gas such as helium, neon, argon, krypton, or xenon for the source gas of the microcrystalline semiconductor film 109, stable plasma can be generated without application of high power. Therefore, plasma damage to the microcrystalline semiconductor film 109 can be reduced and the crystallinity of the microcrystalline semiconductor film 109 can be improved.

For generation of glow discharge plasma in the formation step of the microcrystalline semiconductor film 109 by a CVD method, the generation condition of the glow discharge plasma which is described related to the gate insulating film 105 can be employed as appropriate.

Note that before the microcrystalline semiconductor film 109 is formed, a deposition gas containing silicon or germanium may be introduced into the process chamber of the CVD apparatus while the gas in the process chamber is discharged so that impurities in the process chamber can be removed. Thus, the amount of the impurities in the microcrystalline semiconductor film 109 can be reduced.

Figure 3B:
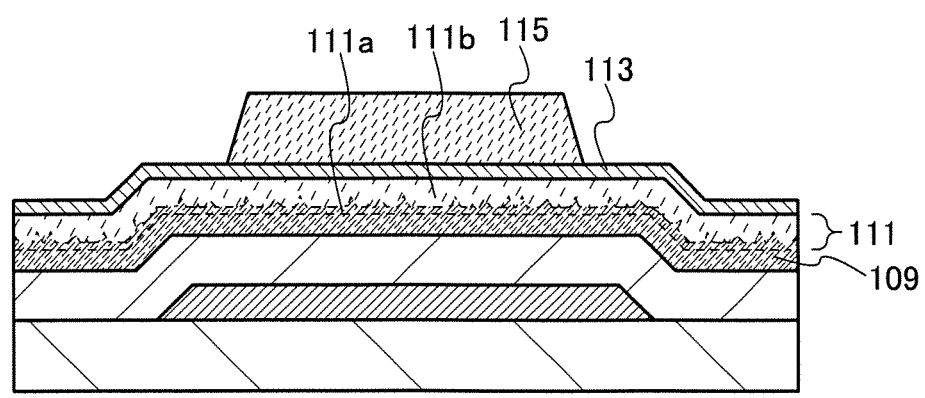

Then, as illustrated in FIG. 3B, a semiconductor film 111 is formed over the microcrystalline semiconductor film 109. The semiconductor film 111 includes a microcrystalline semiconductor region 111a and an amorphous semiconductor region 111b. Then, an impurity semiconductor film 113 is formed over the semiconductor film 111. Then, a mask 115 is formed of a resist over the impurity semiconductor film 113.

The semiconductor film 111 including the microcrystalline semiconductor region 111a and the amorphous semiconductor region 111b can be formed under a condition which causes partial crystal growth using the microcrystalline semiconductor film 109 as a seed crystal (a condition under which the crystal growth is suppressed).

The semiconductor film 111 is formed in the process chamber of the plasma CVD apparatus by glow discharge plasma using a mixture of hydrogen, a gas containing nitrogen, and the deposition gas containing silicon or germanium. Examples of the gas containing nitrogen include ammonia, nitrogen, nitrogen fluoride, nitrogen chloride, chloroamine, fluoroamine, and the like. Glow discharge plasma can be generated as in the case of the gate insulating film 105.

In this case, the flow ratio of hydrogen and the deposition gas containing silicon or germanium is set so as to allow the formation of a microcrystalline semiconductor film as in the case of the microcrystalline semiconductor film 109, and a gas containing nitrogen is further used for the source gas, whereby crystal growth can be suppressed as compared to the deposition condition for the microcrystalline semiconductor film 109. Specifically, since a gas containing nitrogen is included in the source gas, the crystal growth is partly suppressed at an early stage of the deposition of the semiconductor film 111; thus, a conical or pyramidal microcrystalline semiconductor region grows, and an amorphous semiconductor region is formed. Furthermore, at a middle stage or a later stage of the deposition, the crystal growth of the conical or pyramidal microcrystalline semiconductor region stops, and only the amorphous semiconductor region is deposited. As a result, in the semiconductor film 111, the microcrystalline semiconductor region 111a and the amorphous semiconductor region 111b which is formed using a well-ordered semiconductor film having fewer defects and a steep tail of a level at a band edge in the valence band, can be formed.

Here, a typical example of a condition for forming the semiconductor film 111 is a condition where the flow rate of hydrogen is 10 times to 2000 times, preferably 10 times to 200 times that of the deposition gas containing silicon or germanium. Note that in a typical example of a condition for forming a normal amorphous semiconductor layer, the flow rate of hydrogen is 0 times to 5 times that of the deposition gas containing silicon or germanium.

By adding a rare gas such as helium, neon, argon, krypton, or xenon to the source gas of the semiconductor film 111, the deposition rate can be increased.

The thickness of the semiconductor film 111 is preferably 50 nm to 350 nm, more preferably 120 nm to 250 nm.

Here, the semiconductor film 111 including the microcrystalline semiconductor region 111*a* and the amorphous semiconductor region 111*b* is formed using the source gas including the gas containing nitrogen. Alternatively, the semiconductor film 111 including the microcrystalline semiconductor region 111*a* and the amorphous semiconductor region 111*b* can be formed in the following manner: the surface of the microcrystalline semiconductor film 109 is exposed to a gas containing nitrogen so that nitrogen is adsorbed to the surface of the microcrystalline semiconductor film 109, and then film deposition is performed using hydrogen and a deposition gas containing silicon or germanium as a source gas.

The impurity semiconductor film 113 is formed in a reaction chamber of the plasma CVD apparatus by glow discharge plasma using a mixture of hydrogen, phosphine (diluted with hydrogen or silane), and a deposition gas containing silicon, whereby amorphous silicon to which phosphorus is added or microcrystalline silicon to which phosphorus is added is formed. In the case of manufacturing a p-channel thin film transistor, the impurity semiconductor film 113 may be formed using glow discharge plasma using diborane instead of phosphine.

Further, in the case where the impurity semiconductor film 113 is formed using microcrystalline silicon to which phosphorus is added or microcrystalline silicon to which boron is added, a microcrystalline semiconductor film, typically a microcrystalline silicon film, is formed between the semiconductor film 111 and the impurity semiconductor film 113, so that characteristics of the interface can be improved. As a result, resistance generated at the interface between the impurity semiconductor film 113 and the semiconductor film 111 can be reduced. Therefore, the amount of current flowing through the source region, the semiconductor film, and the drain region of the thin film transistor can be increased and the on-state current and the field-effect mobility can be increased.

The mask 115 formed of a resist can be formed by a photolithography process.

Next, the microcrystalline semiconductor film 109, the semiconductor film 111, and the impurity semiconductor film 113 are etched using the mask 115 formed of a resist. By this step, the microcrystalline semiconductor film 109, the semiconductor film 111, and the impurity semiconductor film 113 are divided into elements, whereby a semiconductor stacked body 117 and an impurity semiconductor film 121 are formed. The semiconductor stacked body 117 includes a microcrystalline semiconductor region 117*a* which includes the microcrystalline semiconductor film 109 and the microcrystalline semiconductor region of the semiconductor film 111; and an amorphous semiconductor region 117*b* which includes the amorphous semiconductor region of the semiconductor film 111. Then, the mask 115 formed of a resist is removed (see FIG. 3C).

Figure 5A:
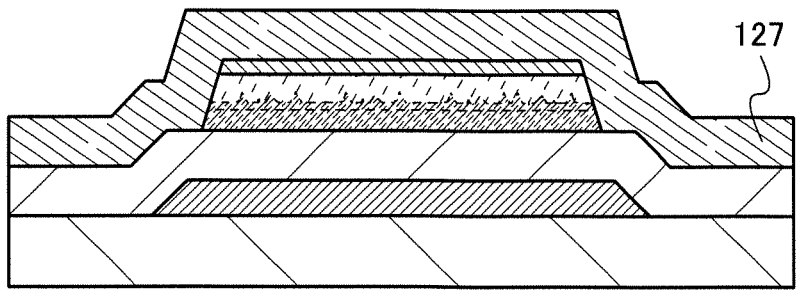
FIGS. 5A to 5C are cross-sectional views illustrating the method for manufacturing the thin film transistor according to one embodiment of the present invention.

Next, a conductive film 127 is formed over the impurity semiconductor film 121 (see FIG. 5A). The conductive film 127 is formed by a CVD method, a sputtering method, or a vacuum evaporation method. Alternatively, the conductive film 127 may be formed by discharging a conductive nanopaste of silver, gold, copper, or the like by a screen printing method, an inkjet method, or the like and baking the conductive nanopaste.

Figure 5B:
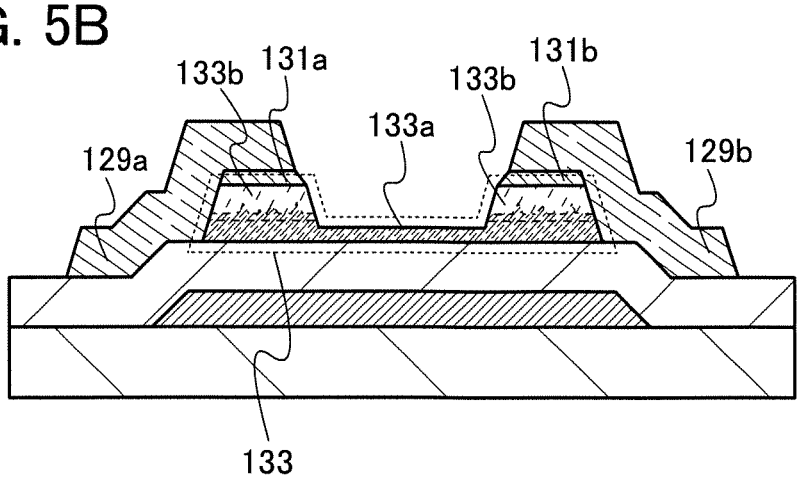

Then, a mask is formed of a resist by a photolithography process, and the conductive film 127 is etched with the use of the mask formed of a resist, whereby the wirings 129*a* and 129*b* serving as a source electrode and a drain electrode are formed (see FIG. 5B). The etching of the conductive film 127 may be either dry etching or wet etching. Note that one of the wirings 129*a* and 129*b* serves as a signal line as well as a source electrode or a drain electrode. However, without limitation thereto, a signal line may be provided separately from the source and drain electrodes.

Then, the impurity semiconductor film 121 and the semiconductor stacked body 117 are partly etched, whereby the impurity semiconductor films 131*a* and 131*b* serving as a source and drain regions are formed. Further, the semiconductor stacked body 133 including the microcrystalline semiconductor region 133*a* and the pair of amorphous semiconductor regions 133*b* is formed. At this point, the semiconductor stacked body 117 is etched so that the microcrystalline semiconductor region 133*a* has a concave portion and the microcrystalline semiconductor region containing nitrogen is removed, whereby the semiconductor stacked body 133 having the following structure is formed: in regions which are covered with the wirings 129*a* and 129*b*, the microcrystalline semiconductor region 133*a* and the amorphous semiconductor region 133*b* are stacked, and in a region which is covered with neither the wiring 129*a* nor the wiring 129*b* and overlaps with the gate electrode, the microcrystalline semiconductor region 133*a* is exposed. The exposed portion of the microcrystalline semiconductor region 133*a* at that time is flat.

Here, ends of the wirings 129*a* and 129*b* are aligned with ends of the impurity semiconductor films 131*a* and 131*b*. However, the ends of the wirings 129*a* and 129*b* and the ends of the impurity semiconductor films 131*a* and 131*b* are not necessarily aligned with each other; the ends of the wirings 129*a* and 129*b* may be positioned on the inner side than the ends of the impurity semiconductor films 131*a* and 131*b* in a cross section.

Next, dry etching may be performed. The dry etching is performed under a condition where the exposed microcrystalline semiconductor region 133*a* and the exposed amorphous semiconductor region 133*b* are not damaged and the etching rates of the microcrystalline semiconductor region 133*a* and the amorphous semiconductor region 133*b* are low. As an etching gas, $Cl_2$, $CF_4$, $N_2$, or the like is typically used. There is no particular limitation on an etching method, and an inductively coupled plasma (ICP) method, a capacitively coupled plasma (CCP) method, an electron cyclotron resonance (ECR) method, a reactive ion etching (RIE) method, or the like can be used.

Then, the surfaces of the microcrystalline semiconductor region 133*a* and the amorphous semiconductor region 133*b* are subjected to plasma treatment typified by water plasma treatment, oxygen plasma treatment, ozone plasma treatment, $N_2O$ plasma treatment, plasma treatment using an oxidizing gas atmosphere, an example of which is plasma treatment using a mixed gas of oxygen and hydrogen, or the like.

Water plasma treatment can be performed in such a manner that a gas containing water as a main component typified by water vapor ($H_2O$ vapor) is introduced into a reaction space and plasma is generated. After that, the mask formed of a resist is removed. The mask formed of a resist may be removed before the dry etching of the impurity semiconductor film 121 and the semiconductor stacked body 117.

As described above, after the microcrystalline semiconductor region 133a and the amorphous semiconductor region 133b are formed, dry etching is additionally performed under a condition where the microcrystalline semiconductor region 133a and the amorphous semiconductor region 133b are not damaged, whereby an impurity such as a residue over the exposed microcrystalline semiconductor region 133a and the exposed amorphous semiconductor region 133b can be removed. Further, the dry etching may be followed by water plasma treatment or plasma treatment using a mixed gas of hydrogen and oxygen, whereby a residue of the mask formed of a resist can be removed and defects of the microcrystalline semiconductor region 133a can be reduced. Further, by the plasma treatment using an oxidizing gas atmosphere, an oxide insulating film can be formed on a surface of the microcrystalline semiconductor region on the insulating film 137 side, thereby ensuring insulation between the source region and the drain region; accordingly, in the resulting thin film transistor, off-state current can be reduced and a variation in electrical characteristics can be reduced.

Note that the mask is formed of a resist by a photolithography process over the conductive film 127, and the conductive film 127 is etched using the mask; whereby the wirings 129a and 129b serving as the source and drain electrodes are formed. Then, the impurity semiconductor film 121 is etched, whereby the impurity semiconductor films 131a and 131b serving as the source and drain regions are formed. At this time, part of the semiconductor stacked body 117 is etched in some cases. Then, the semiconductor stacked body 117 may be partly etched after the mask formed of a resist is removed to form the semiconductor stacked body 133 including the microcrystalline semiconductor region 133a and the pair of amorphous semiconductor regions 133b. In the case where a mixed gas of oxygen, HBr, and at least one of $CF_4$, $NF_3$, and $SF_6$ is used as an etching gas of the above etching step, a residue to be generated in the etching can be reduced, which can lead to a reduction in a variation in electric characteristics of the thin film transistor.

Further, since the microcrystalline semiconductor region 117a is covered with the amorphous semiconductor region 117b in the step of removing the mask formed of a resist, the microcrystalline semiconductor region 117a is prevented from being in contact with a resist stripper and a residue of the resist. Further, since the amorphous semiconductor region 117b is etched using the wirings 129a and 129b to expose the microcrystalline semiconductor region 133a after the mask formed of a resist is removed, the amorphous semiconductor region which is in contact with the resist stripper and a residue of the resist is not left in a back channel. Consequently, leakage current due to the resist stripper and the residue of the resist left in the back channel is not generated, which can further reduce the off-state current of the thin film transistor.

Through the above process, a single-gate thin film transistor can be manufactured. A single-gate thin film transistor with high on-state current and high field-effect mobility, and low off-state current, in which change in electrical characteristics is suppressed can be manufactured with high productivity.

Then, the insulating film 137 is formed over the semiconductor stacked body 133 and the wirings 129a and 129b. The insulating film 137 can be formed in a manner similar to that of the gate insulating film 105.

Then, an opening (not illustrated) is formed in the insulating film 137 with the use of a mask which is formed of a resist by a photolithography process. Then, the back gate electrode 139 may be formed over the insulating film 137 (see FIG. 5C). Through the above process, a dual-gate thin film transistor can be manufactured.

The back gate electrode 139 can be formed by forming a thin film using any of the above materials by a sputtering method, and then etching the thin film using a mask formed of a resist by a photolithography process. Alternatively, the back gate electrode 139 can be formed by applying or printing the conductive composition including a conductive polymer having a light-transmitting property, and baking the composition.

Next, the shape of the back gate electrode is described with reference to FIGS. 6A to 6D, which are top views of the thin film transistor.

Figure 6A:
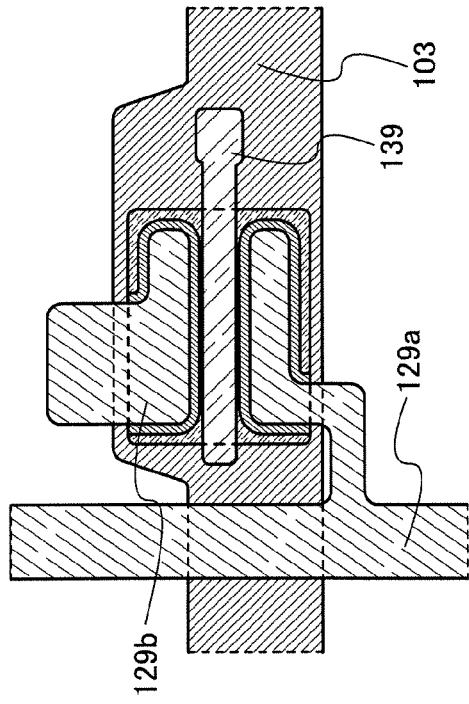
FIGS. 6A to 6D are top views illustrating thin film transistors according to one embodiment of the present invention.

As illustrated in FIG. 6A, the back gate electrode 139 can be formed in parallel to the gate electrode 103. In this case, potential applied to the back gate electrode 139 and potential applied to the gate electrode 103 can be controlled independently. Thus, the threshold voltage of the thin film transistor can be controlled. Further, regions in which carriers flow, that is, channel regions are formed on the gate insulating film 105 side and on the insulating film 137 side in the microcrystalline semiconductor region; thus, the on-state current of the thin film transistor can be increased.

Figure 6C:
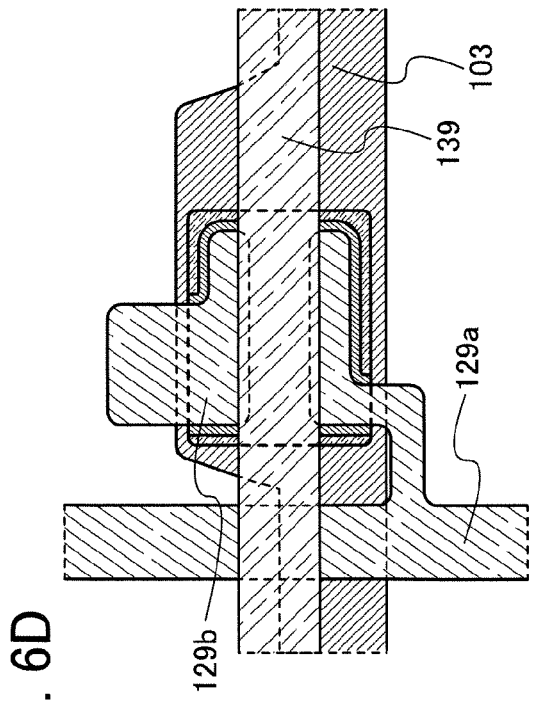
Figure 6B:
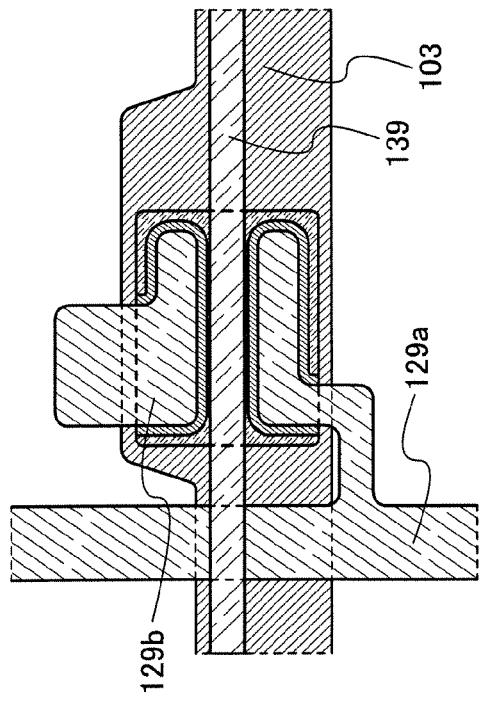

As illustrated in FIG. 6B, the back gate electrode 139 can be connected to the gate electrode 103. That is, the gate electrode 103 and the back gate electrode 139 can be connected through an opening 150 formed in the gate insulating film 105 and the insulating film 137. In this case, potential applied to the back gate electrode 139 and potential applied to the gate electrode 103 are equal to each other. Therefore, regions in which carriers flow in a semiconductor film, that is, channel regions are formed on the gate insulating film 105 side and on the insulating film 137 side in the microcrystalline semiconductor region; thus, the on-state current of the thin film transistor can be increased.

Further alternatively, as illustrated in FIG. 6C, the back gate electrode 139 is not necessarily connected to the gate electrode 103 and may be in a floating state. In that case, channel regions are formed on the gate insulating film 105 side and on the insulating film 137 side in the microcrystalline semiconductor region without potential applied to the back gate electrode 139; thus, the on-state current of the thin film transistor can be increased.

Figure 6D:
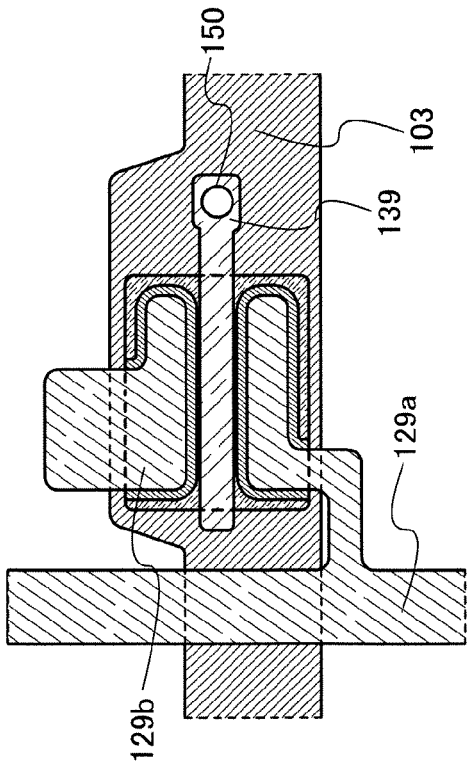

Further, as illustrated in FIG. 6D, the back gate electrode 139 may overlap with the wirings 129a and 129b with the insulating film 137 provided therebetween. Although the back gate electrode 139 of FIG. 6A is used in FIG. 6D, the back gate electrode 139 of FIG. 6B or FIG. 6C may also overlap with the wirings 129a and 129b.

In this embodiment, since cleaning of the inside of the process chamber and formation of the protective film are performed before the microcrystalline semiconductor film is formed over the gate insulating film, the nitrogen concentration of the microcrystalline semiconductor film in contact with the gate insulating film can be reduced. In the thin film transistor described in this embodiment, the nitrogen concentration is low in regions of the microcrystalline semiconductor region to be the channel region, which are on the gate insulating film side and the insulating film side; thus, defects in those regions can be reduced. Thus, the thin film transistor can have improved reliability. Further, the microcrystalline semiconductor region having a conical or pyramidal shape and containing nitrogen is included in the microcrystalline semiconductor regions which overlap with the impurity semiconductor films functioning as the source and drain regions. Thus, resistance in the vertical direction (the film thickness direction) of when voltage is applied between the source and drain electrodes in an on state can be lowered. Further, tunnel current does not easily flow and the off-state current can be reduced because the amorphous semiconductor region containing nitrogen which is a well-ordered semiconductor having fewer defects and a steep tail of a level at a band edge in the valence band is provided between the microcrystalline semiconductor region and the impurity semiconductor film. A thin film transistor with high on-state current and high field-effect mobility, and low off-state current, in which change in electrical characteristics is suppressed can be manufactured.

Embodiment 2

In this embodiment, a method for forming a microcrystalline semiconductor film whose nitrogen concentration is low, which is different from that described in Embodiment 1 is described with reference to FIGS. 7A and 7B. This embodiment is different from Embodiment 1 in that a so-called multi-chamber CVD apparatus, which is provided with a plurality of process chambers, is used for forming a gate insulating film and a microcrystalline semiconductor film.

Figure 7A:
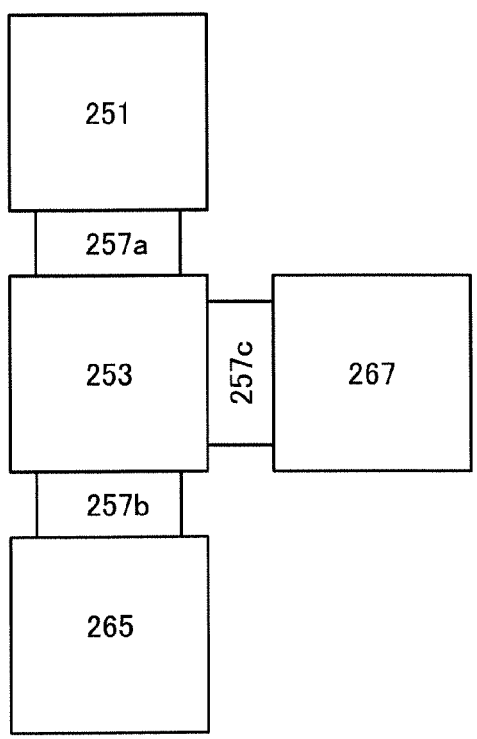
FIGS. 7A and 7B are a schematic diagram of a CVD apparatus and a flow chart illustrating a method for manufacturing a thin film transistor according to one embodiment of the present invention, respectively.
Figure 7B:
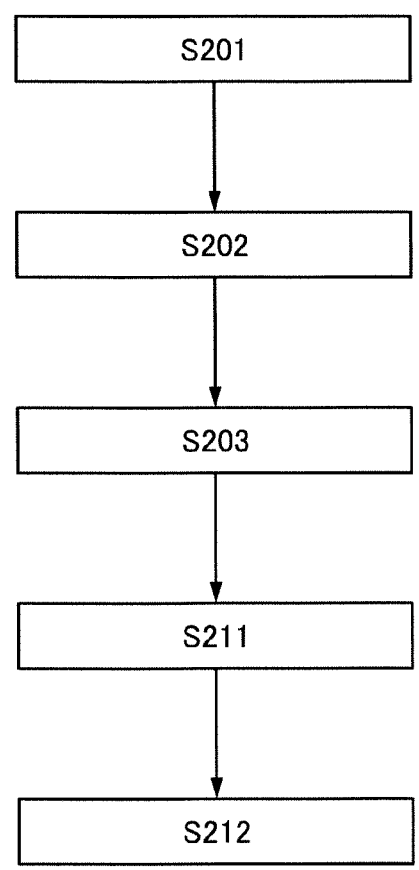

FIG. 7A is a schematic diagram of a CVD apparatus and FIG. 7B is a flow chart illustrating a process from and including a step for depositing the gate insulating film to and including a step for depositing the microcrystalline semiconductor film.

The schematic diagram of the CVD apparatus is shown in FIG. 7A. The CVD apparatus includes the load lock chamber 251, the transfer chamber 253, a first process chamber 265, and a second process chamber 267. The gate valve 257a is provided between the load lock chamber 251 and the transfer chamber 253, the gate valve 257b is provided between the transfer chamber 253 and the first process chamber 265, and a gate valve 257c is provided between the transfer chamber 253 and the second process chamber 267. Each of the gate valves can be set to a predetermined pressure.

Similarly to Embodiment 1, the substrate 101 with the gate electrode 103 is set in a cassette of the load lock chamber 251 of the CVD apparatus and transferred to the first process chamber 265 through the transfer chamber 253 (S201 in FIG. 7B). After that, the gate valve 257b is closed. Then, similarly to Embodiment 1, the gate insulating film 105 is formed over the substrate 101 and the gate electrode 103 (S202 in FIG. 7B).

Subsequently, the gate valve 257b is opened and then the substrate is transferred to the process chamber 253 (S203 in FIG. 7B). After that, the gate valve 257b is closed.

Subsequently, the gate valve 257c is opened and then the substrate is transferred to the second process chamber 267 (S211 in FIG. 7B). After that, the gate valve 257c is closed. Then, the microcrystalline semiconductor film 109 is formed over the gate insulating film 105 (S212 in FIG. 7B).

In this embodiment, the first process chamber 265 is a process chamber in which only the gate insulating film is formed; the second process chamber 267 is a process chamber in which only the microcrystalline semiconductor film is formed. By forming the gate insulating film 105 and the microcrystalline semiconductor film 109 in different process chambers, mixture of impurities into the microcrystalline semiconductor film 109 can be suppressed. Thus, the nitrogen concentration of the microcrystalline semiconductor film 109 can be reduced.

Embodiment 3

In this embodiment, a method is described with reference to FIG. 4A and FIG. 8, by which the concentration of nitrogen contained in a microcrystalline semiconductor film can be further reduced as compared to Embodiments 1 and 2. Note that in this embodiment, description is made using Embodiment 1; however, this embodiment can also be applied to Embodiment 2 as appropriate.

Figure 8:
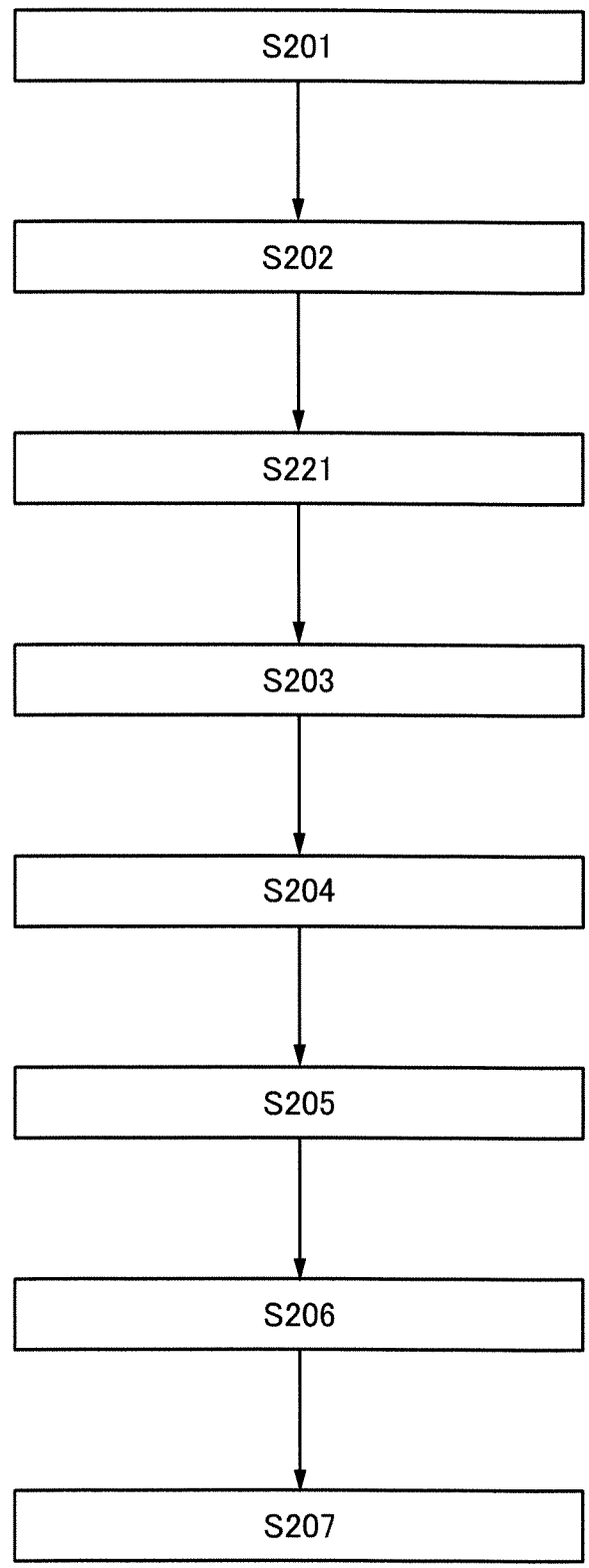
FIG. 8 is a flow chart illustrating a method for manufacturing a thin film transistor according to one embodiment of the present invention.

Similarly to Embodiment 1, the substrate 101 with the gate electrode 103 is set in a cassette of the load lock chamber 251 of the CVD apparatus and transferred to the process chamber 255 through the transfer chamber 253 (S201 in FIG. 8). After that, the gate valve 257b is closed. Then, similarly to Embodiment 1, the gate insulating film 105 is formed over the substrate 101 and the gate electrode 103 (S202 in FIG. 8).

Then, an oxidizing gas is introduced into the process chamber 255, and then glow discharge is generated to expose a surface of the gate insulating film 105 to oxygen plasma, so that an oxide insulating film is formed on the surface of the gate insulating film 105 (S221 in FIG. 8). As the oxide insulating film, a silicon oxide film, an aluminum oxide film, or the like can be given.

Examples of the oxidizing gas include oxygen, ozone, dinitrogen monoxide, water vapor, and a mixed gas of oxygen and hydrogen. By forming the oxide insulating film on the surface of the gate insulating film 105 by exposure of the gate insulating film 105 to the oxygen plasma, nitrogen or other impurities can be prevented from being desorbed from the gate insulating film 105 to the inside of the process chamber in a later step of forming the microcrystalline semiconductor film 109. Thus, the nitrogen concentration of the microcrystalline semiconductor film 109 can be further reduced. Further, the nitrogen concentration of the microcrystalline semiconductor film 109 can be still further reduced in the case where plasma is generated in an atmosphere of a gas containing no nitrogen, examples of which are oxygen, ozone, water vapor, and a mixed gas of oxygen and hydrogen, because an oxide insulating film with a reduced nitrogen concentration can be formed on the surface of the gate insulating film 105.

Subsequently, the gate valve 257b is opened and then the substrate is transferred to the transfer chamber 253 (S203 in FIG. 8). After that, the gate valve 257b is closed.

Then, similarly to Embodiment 1, the inside of the process chamber 255 is cleaned (S204 in FIG. 8).

Then, a protective film is formed on the inner wall of the process chamber 255 (S205 in FIG. 8).

Subsequently, the gate valve 257b is opened and then the substrate is transferred to the process chamber 255 (S206 in FIG. 8). After that, the gate valve 257b is closed.

After that, the microcrystalline semiconductor film 109 is formed over the gate insulating film 105 (S207 in FIG. 8).

In this embodiment, the oxide insulating film serving as a protective film can be formed on the surface of the gate insulating film by performing the oxygen plasma treatment on the surface of the gate insulating film; thus, mixture of impurities into the microcrystalline semiconductor film 109 can be suppressed. Accordingly, the impurity concentration, and moreover, the nitrogen concentration of the microcrystalline semiconductor film 109 can be reduced.

Embodiment 4

In this embodiment, a method for forming a microcrystalline semiconductor film in which mixed phase grains are more densely formed as compared to the microcrystalline semiconductor films in Embodiments 1 to 3 is described with reference to FIGS. 9A and 9B.

Figure 9A:
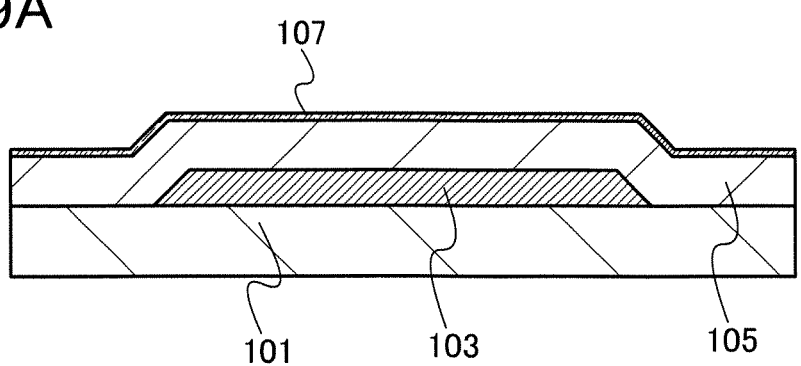
FIGS. 9A and 9B are cross-sectional views illustrating a method for manufacturing a thin film transistor according to one embodiment of the present invention.

As illustrated in FIG. 9A, similarly to Embodiment 1, the gate electrode 103 is formed over the substrate 101 and the gate insulating film 105 is formed over the substrate 101 and the gate electrode 103. Then, the seed crystal 107 is formed over the gate insulating film 105.

The seed crystal 107 is formed using a microcrystalline semiconductor film typified by a microcrystalline silicon film, a microcrystalline silicon germanium film, or the like. The seed crystal 107 may be in a state in which mixed phase grains are dispersed, in which mixed phase grains are continuously provided and form a film, or in which mixed phase grains and an amorphous semiconductor are continuously provided and form a film. The seed crystal 107 may have a space between adjacent mixed phase grains without the mixed phase grains being in contact with each other.

The seed crystal 107 is formed in a reaction chamber of a plasma CVD apparatus by glow discharge plasma using a mixture of hydrogen and a deposition gas containing silicon or germanium, under a condition by which the crystallinity is increased. Alternatively, the seed crystal 107 is formed by glow discharge plasma using a mixture of hydrogen, a deposition gas containing silicon or germanium, and a rare gas such as helium, neon, argon, krypton, or xenon. Here, microcrystalline silicon, microcrystalline silicon germanium, or the like is formed under a condition where the flow rate of hydrogen is greater than or equal to 50 times and less than or equal to 1000 times that of the deposition gas containing silicon or germanium so that the deposition gas is diluted, and the pressure in the process chamber is greater than or equal to 67 Pa and less than or equal to 13332 Pa (greater than or equal to 0.5 Torr and less than or equal to 100 Torr). The deposition temperature at this time is preferably room temperature to 350° C., more preferably 150° C. to 280° C. The distance between an upper electrode and a lower electrode is set to a distance which allows generation of plasma. With the condition by which the crystallinity is increased, crystal growth is promoted and the crystallinity of the mixed phase grain is improved. That is, the size of the crystallite included in the mixed phase grain is increased.

When a rare gas such as helium, neon, argon, krypton, or xenon is added to a source gas of the seed crystal 107, the deposition rate of the seed crystal 107 is increased. When the deposition rate is increased, the amount of impurities mixed into the seed crystal 107 can be reduced. Accordingly, the crystallinity of the seed crystal 107 can be improved. By using a rare gas such as helium, neon, argon, krypton, or xenon for the source gas of the seed crystal 107, stable plasma can be generated without application of high power. Therefore, plasma damage to the seed crystal 107 can be reduced and the crystallinity of the mixed phase grains can be improved.

For generation of glow discharge plasma in the formation of the seed crystal 107, the condition of the microcrystalline semiconductor film 109 can be employed as appropriate.

Figure 9B:
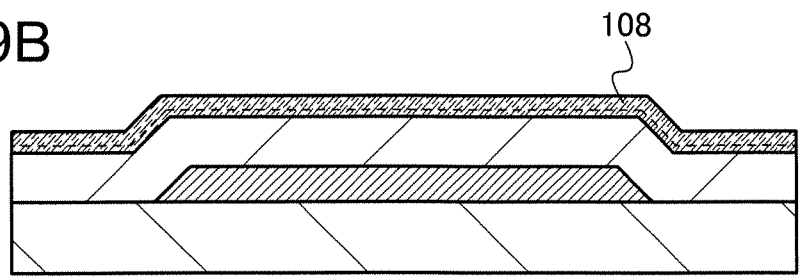

Then, as illustrated in FIG. 9B, a microcrystalline semiconductor film 108 is formed over the seed crystal 107. The microcrystalline semiconductor film 108 is formed under a condition which allows crystals of mixed phase grains to grow so that the space between the mixed phase grains is filled. Note that the thickness of the microcrystalline semiconductor film 108 is preferably greater than or equal to 30 nm and less than or equal to 100 nm.

The microcrystalline semiconductor film 108 is formed in the reaction chamber of the plasma CVD apparatus by glow discharge plasma using a mixture of hydrogen and a deposition gas containing silicon or germanium, and setting the pressure in the process chamber to greater than or equal to 1333 Pa and less than or equal to 13332 Pa (greater than or equal to 10 Torr and less than or equal to 100 Torr). Alternatively, the microcrystalline semiconductor film 108 may be formed by glow discharge plasma using a mixture of a source gas and a rare gas such as helium, neon, argon, krypton, or xenon, and setting the pressure in the process chamber to greater than or equal to 1333 Pa and less than or equal to 13332 Pa (greater than or equal to 10 Torr and less than or equal to 100 Torr). Note that the flow ratio of hydrogen and the deposition gas containing silicon or germanium may be periodically increased and decreased, and the pressure in the process chamber may be greater than or equal to 1333 Pa and less than or equal to 13332 Pa (greater than or equal to 10 Torr and less than or equal to 100 Torr).

Microcrystalline silicon, microcrystalline silicon germanium, or the like is formed under a condition by which the space between the seed crystals 107 is filled and also the crystal growth is promoted. As a result, in the microcrystalline semiconductor film 108, the ratio of the crystal regions to the amorphous semiconductor is increased and the space between the mixed phase grains is reduced, whereby the crystallinity is improved. The deposition temperature at this time is preferably room temperature to 350° C., more preferably 150° C. to 280° C. The distance between the upper electrode and the lower electrode is set to a distance which allows generation of plasma.

The condition for generating glow discharge plasma in the formation of the microcrystalline semiconductor film 109 described in Embodiment 1 can be employed as appropriate for generating glow discharge plasma in the formation of the microcrystalline semiconductor film 108. In the case where the condition for generating glow discharge plasma in the formation of the seed crystal 107 and that in the formation of the microcrystalline semiconductor film 108 are the same, throughput can be increased. Note that the conditions may be different from each other.

When the deposition condition of the microcrystalline semiconductor film 108 is set as follows, owing to the high pressure in the process chamber, a mean free path of the deposition gas becomes short and the energy of plasma ions is reduced, which leads to improvement of the coverage with the microcrystalline semiconductor film 108, a reduction in ion damage to the microcrystalline semiconductor film 108, and a reduction in defects: the flow rate of hydrogen is greater than or equal to 100 times and less than or equal to 2000 times that of a deposition gas containing silicon or germanium so that the deposition gas is diluted, and the pressure in the process chamber is greater than or equal to 1333 Pa and less than or equal to 13332 Pa (greater than or equal to 10 Torr and less than or equal to 100 Torr). Further, under the above condition, since the dilution ratio of the deposition gas containing silicon or germanium is high and the amount of generated hydrogen radicals is increased, the crystal grows using the crystallite in the mixed phase grain as a seed crystal while the amorphous semiconductor region is etched. As a result, in the microcrystalline semiconductor film 108, the ratio of the crystal regions to the amorphous semiconductor region is increased and the crystallinity is improved. Further, defects in the microcrystalline semiconductor film 108 are reduced.

Through the above steps, the microcrystalline semiconductor film having high crystallinity in which the density of mixed phase grains is high can be formed.

Note that the pressure in the deposition condition of the microcrystalline semiconductor film 108 may be set to higher than that in the deposition condition of the seed crystal 107. Alternatively, the pressure in the deposition condition of the microcrystalline semiconductor film 108 may be set to lower than that in the deposition condition of the seed crystal 107. Further alternatively, the pressure in the deposition condition of the seed crystal 107 may be set to the same as that in the deposition condition of the microcrystalline semiconductor film 108.

The thickness of the seed crystal 107 is preferably greater than or equal to 1 nm and less than or equal to 10 nm. If the thickness of the seed crystal 107 is greater than 10 nm, even when the microcrystalline semiconductor film 108 is deposited, it is difficult to fill the space between the mixed phase grains and to etch the amorphous semiconductor contained in the seed crystal 107, which reduces the crystallinity of the seed crystal 107 and the microcrystalline semiconductor film 108. In addition, since the mixed phase grain needs to be formed in the seed crystal 107, the thickness of the seed crystal 107 is preferably 1 nm or more.

The thickness of the microcrystalline semiconductor film 108 is preferably greater than or equal to 30 nm and less than or equal to 100 nm. The reason for this is as follows: when the microcrystalline semiconductor film 108 has a thickness of 30 nm or more, a variation in electrical characteristics of thin film transistors can be reduced; and when the microcrystalline semiconductor film 108 has a thickness of 100 nm or less, throughput can be increased and film peeling due to stress can be suppressed.

According to this embodiment, a microcrystalline semiconductor film having higher crystallinity with a reduced space between mixed phase grains can be formed.

Note that, for further increasing the crystallinity of the microcrystalline semiconductor film, another microcrystalline semiconductor film may be formed over the microcrystalline semiconductor film 108 under a condition by which the crystallinity is increased. A condition by which the crystallinity is higher than that of the microcrystalline semiconductor film 108 is as follows: the flow ratio of hydrogen to the deposition gas containing silicon or germanium is higher than that in the deposition condition of the microcrystalline semiconductor film 108 and the deposition gas is diluted, and the pressure in the process chamber is greater than or equal to 1333 Pa and less than or equal to 13332 Pa (greater than or equal to 10 Torr and less than or equal to 100 Torr).

Another condition by which the crystallinity is higher than that of the microcrystalline semiconductor film 108 is as follows, similarly to the deposition condition for the microcrystalline semiconductor film 108: the flow ratio of hydrogen and the deposition gas containing silicon or germanium is periodically increased and decreased, and the pressure in the process chamber is greater than or equal to 1333 Pa and less than or equal to 13332 Pa (greater than or equal to 10 Torr and less than or equal to 100 Torr). In the above condition, during the period when the flow ratio of hydrogen to the deposition gas containing silicon or germanium is low, the flow ratio of hydrogen may be set to be higher than that in the deposition condition of the microcrystalline semiconductor film 108, whereby the crystallinity can be further improved.

Subsequently, the process including and after the step shown in FIG. 3B which is described in Embodiment 1 is performed, whereby a thin film transistor with high on-state current and high field-effect mobility, and low off-state current, in which change in electrical characteristics is suppressed can be manufactured.

Although the description is made with reference to Embodiment 1 in this embodiment, a description in another embodiment may be referred to as appropriate.

Embodiment 5

In this embodiment, a method for manufacturing a thin film transistor, by which the off-state current can be further reduced as compared to the off-state current in any of Embodiments 1 to 4, will be described with reference to FIGS. 3A to 3C and FIGS. 10A to 10C.

Figure 3C:
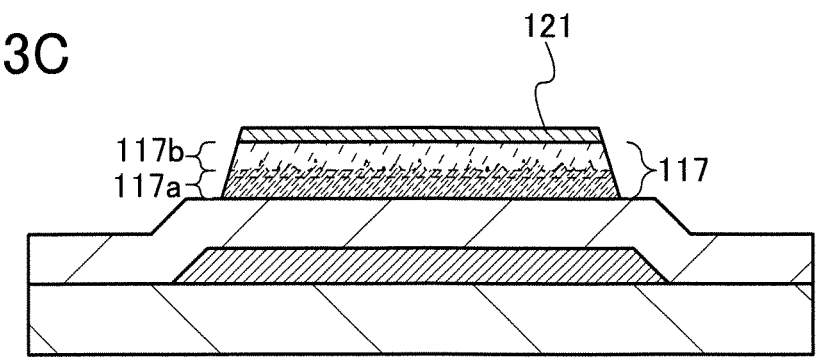
Figure 10A:
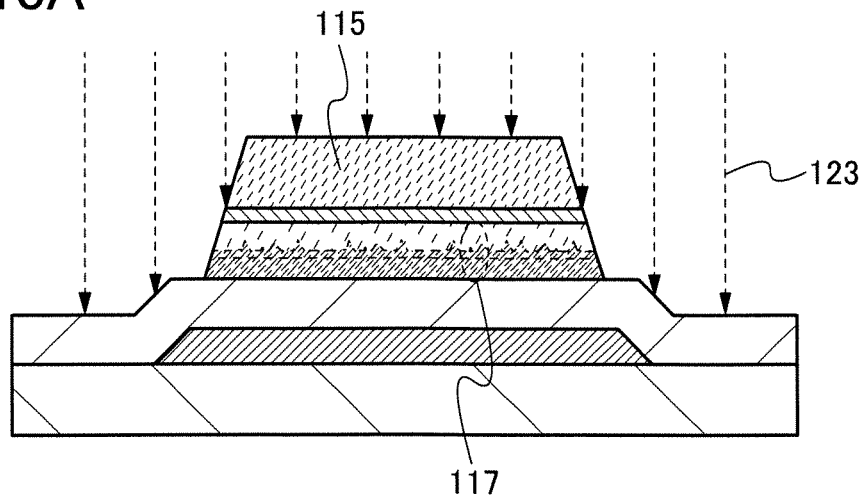
FIGS. 10A to 10C are cross-sectional views illustrating a method for manufacturing a thin film transistor according to one embodiment of the present invention.

As in Embodiment 1, the semiconductor stacked body 117 in FIG. 10A is formed through the process illustrated in FIGS. 3A to 3C.

Next, plasma treatment is performed in which a side surface of the semiconductor stacked body 117 is exposed to plasma 123 while the mask 115 formed of a resist is left. Here, plasma is generated in an oxidizing gas atmosphere or a nitriding gas atmosphere, and the semiconductor stacked body 117 is exposed to the plasma 123. Examples of the oxidizing gas include oxygen, ozone, dinitrogen monoxide, water vapor, and a mixed gas of oxygen and hydrogen. Examples of the nitriding gas include nitrogen, ammonia, nitrogen fluoride, nitrogen chloride, chloroamine, and fluoroamine. By generating plasma in an oxidation gas or a nitriding gas, an oxygen radical or a nitrogen radical is generated. The radical reacts with the semiconductor stacked body 117, thereby forming an insulating region on the side surface of the semiconductor stacked body 117. Note that instead of irradiation with plasma, irradiation with ultraviolet light may be performed for generation of an oxygen radical or a nitrogen radical.

Figure 10B:
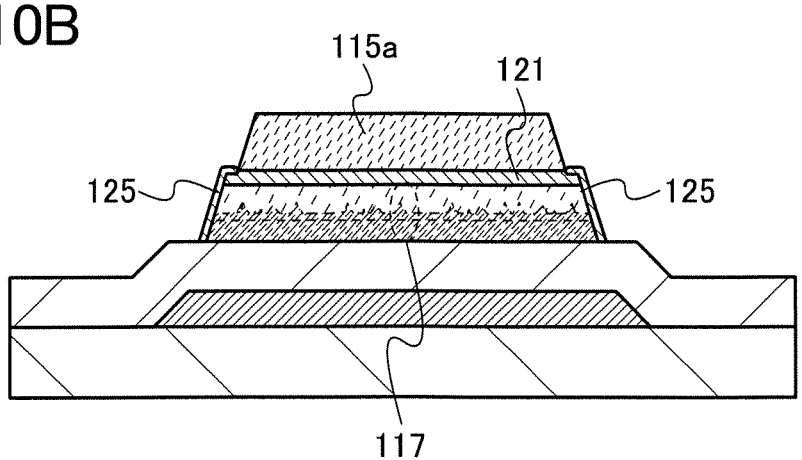
Figure 10C:
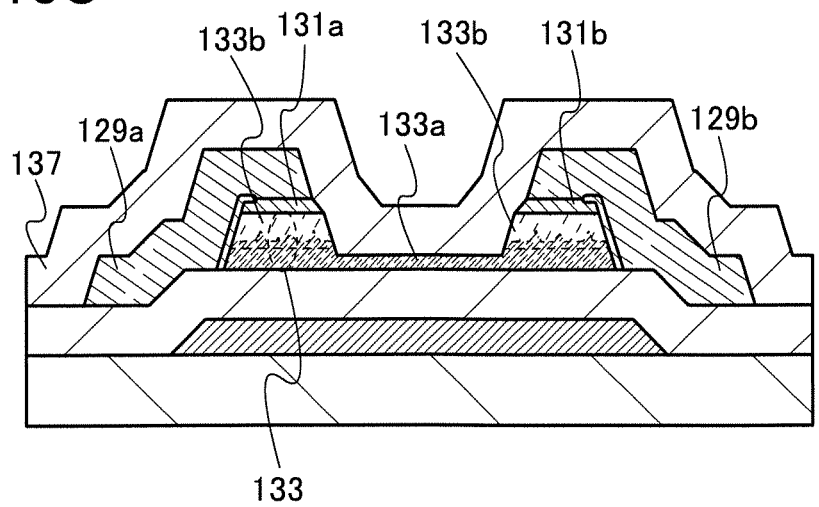

In the case of using oxygen, ozone, water vapor, or a mixed gas of oxygen and hydrogen as the oxidizing gas, the resist recedes by plasma irradiation, whereby a mask 115a whose top and bottom surfaces are reduced in area is formed as illustrated in FIG. 10B. Consequently, through the plasma treatment, the exposed impurity semiconductor film 121 is oxidized in addition to the side surface of the semiconductor stacked body 117, whereby an insulating region 125 is formed on the side surface of the semiconductor stacked body 117 and on the side surface and part of the top surface of the impurity semiconductor film 121.

Figure 5C:
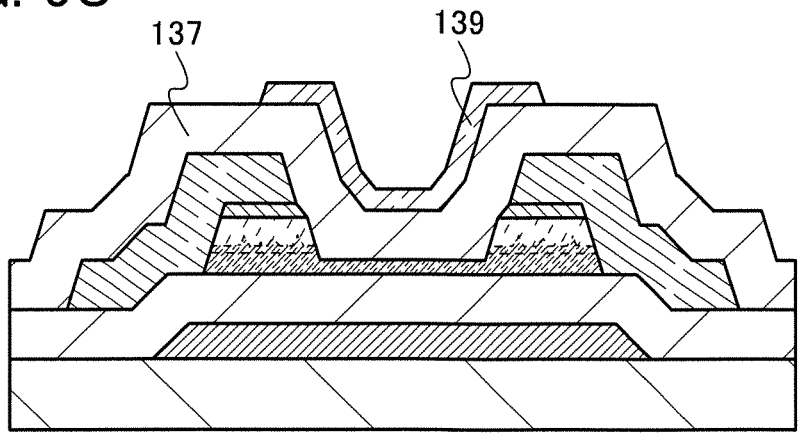

Next, as described in Embodiment 1, through a process similar to the process illustrated in FIGS. 5A and 5B, the wirings 129a and 129b serving as a source electrode and a drain electrode, the impurity semiconductor films 131a and 131b serving as a source region and a drain region, the semiconductor stacked body 133 including the microcrystalline semiconductor region 133a and the pair of amorphous semiconductor regions 133b, and the insulating film 137 are formed as illustrated in FIG. 5C. Accordingly, a single-gate thin film transistor can be manufactured.

Although not shown, when a back gate electrode is formed over the insulating film 137, a dual-gate thin film transistor can be manufactured.

According to this embodiment, since the insulating region is provided between the semiconductor stacked body 133 and the wirings 129a and 129b, holes injected from the wirings 129a and 129b to the semiconductor stacked body 133 can be reduced; thus, a thin film transistor having low off-state current, high field-effect mobility, and high on-state current can be manufactured.

While the description is made with reference to Embodiment 1 in this embodiment, a description in another embodiment may be referred to as appropriate.

Embodiment 6

Thin film transistors are manufactured according to the above embodiment, and a semiconductor device having a display function (also referred to as a display device) can be manufactured using the thin film transistors in a pixel portion and also in a driver circuit. Further, part or the whole of the driver circuit which includes thin film transistors can be formed over the same substrate as the pixel portion, whereby a system-on-panel can be formed.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes an inorganic EL (electroluminescent) element, an organic EL element, and the like. Furthermore, a display medium whose contrast is changed by an electric effect, such as electronic ink, can also be used.

In addition, the display device includes a panel in which the display element is sealed, and a module in which an IC or the like including a controller is mounted on the panel. Furthermore, the display device includes an element substrate provided with a means for supplying current to the display element in each pixel, which is one embodiment before the display element is completed in a manufacturing process of the display device. Specifically, the element substrate may be in a state where only a pixel electrode of the display element is formed, a state in which a conductive film to be a pixel electrode is formed but is not etched yet to form the pixel electrode, or any other states.

Note that a display device in this specification refers to an image display device, a display device, or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or a TCP provided with a printed wiring board at the end thereof; and a module having an integrated circuit (IC) that is directly mounted on a display element by a chip on glass (COG) method.

The semiconductor device described in this embodiment can be manufactured with the use of the thin film transistor described in any one of Embodiments 1 to 5, which has low off-state current, high field-effect mobility, and high on-state current. Accordingly, the area of the thin film transistor can be reduced, which enables high integration of a semiconductor device. Further, when the thin film transistor is used for a driver circuit of a display device as described in this embodiment, the size of the driver circuit can be decreased, which enables the frame of the display device to be narrowed and can reduce image deterioration over time.

Note that the above semiconductor device can be applied to an electronic paper. The electronic paper can be used for electronic devices for displaying information in a variety of fields. For example, an electronic paper can be applied to an electronic book reader (an e-book reader), a poster, digital signage, public information displays (PIDs), advertisements in vehicles such as trains, and displays of various cards such as credit cards.

Further, the above semiconductor device can be applied to a variety of electronic devices (including game machines). Examples of such electronic devices include a television device (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio player, a large-sized game machine such as a pinball machine, and the like.

Example 1

In this example, examination results of the reliability of thin film transistors which were manufactured by the method described in the above embodiment are described. In this example, thin film transistors were manufactured as Samples A to C under different manufacturing conditions, and their reliability was examined.

First, methods for manufacturing Samples A to C are described with reference to cross-sectional views in FIGS. 3A to 3C, FIGS. 5A to 5C, and FIGS. 9A and 9B. Note that although manufacturing conditions of Samples A to C are different from each other, the methods for manufacturing Samples A to C are described with reference to the same drawings, that is, FIGS. 3A to 3C, FIGS. 5A to 5C, and FIGS. 9A and 9B, because the samples have substantially the same cross-sectional structures. A manufacturing step which is described without specific reference to any of Samples A to C is a step common between Samples A to C.

A base insulating film (not illustrated here) was formed over the substrate 101, and the gate electrode 103 was formed over the base insulating film.

Here, a glass substrate (EAGLE XG manufactured by Corning Incorporated) was used as the substrate 101.

The gate electrode 103 had a structure in which an aluminum layer was sandwiched between titanium layers. Specifically, first, a 50-nm-thick first titanium film was formed over the base insulating film by sputtering a titanium target with argon ions. At this time, the flow rate of argon which was introduced into a process chamber was 20 sccm, the pressure in the process chamber was 0.1 Pa, the applied voltage was 12 kW, and the substrate temperature was room temperature. Then, a 100-nm-thick aluminum film was formed over the first titanium film by sputtering an aluminum target with argon ions. At this time, the flow rate of argon which was introduced into the process chamber was 50 sccm, the pressure in the process chamber was 0.4 Pa, the applied voltage was 4 kW and the substrate temperature was room temperature. After that, a 50-nm-thick second titanium film was formed over the aluminum film by sputtering a titanium target with argon ions. The second titanium film was formed by a method similar to that of the first titanium film. In other words, the flow rate of argon which was introduced into the process chamber was 20 sccm, the pressure in the process chamber was 0.1 Pa, the applied voltage was 12 kW, and the temperature was room temperature.

After that, a resist was applied over the second titanium film, irradiated with light using a first photomask, and developed to form a mask formed of a resist.

Next, etching was performed using the mask formed of a resist, whereby the gate electrode 103 was formed. Here, two-step etching was conducted using an inductively coupled plasma (ICP) apparatus in the following manner. The first etching was performed under a condition where the ICP power was 600 W, the bias power was 250 W, boron trichloride and chlorine were introduced at flow rates of 60 sccm and 20 sccm, respectively, as an etching gas, and the pressure in a process chamber was 1.2 Pa. After that, the second etching was performed under a condition where the ICP power was 500 W, the bias power was 50 W, the pressure was 2.0 Pa, carbon tetrafluoride was introduced at a flow rate of 80 sccm as an etching gas, and the pressure in the process chamber was 2.0 Pa. After that, the mask formed of a resist was removed.

Next, the gate insulating film 105 was formed over the gate electrode 103 and the base insulating film.

In this example, a 300-nm-thick silicon nitride film was formed by a plasma CVD method as the gate insulating film 105 and then was subjected to plasma treatment. In the deposition of the silicon nitride film, silane, ammonia, nitrogen, and hydrogen were introduced as a source gas at flow rates of 15 sccm, 500 sccm, 180 sccm, and 200 sccm, respectively; the pressure in a process chamber was 100 Pa; the RF power source frequency was 13.56 MHz; the power of the RF power source was 200 W; and plasma discharge was performed. Note that in the deposition of the gate insulating film 105, a parallel plate plasma CVD apparatus was used, the temperature of an upper electrode was 200° C., the temperature of a lower electrode was 300° C., the distance (the gap) between the upper electrode and the lower electrode was 26 mm.

The plasma treatment was performed on the gate insulating film 105 of each of Samples A and B in a dinitrogen monoxide ($N_2O$) atmosphere; the plasma treatment was performed on the gate insulating film 105 of Sample C in a mixed atmosphere of hydrogen and oxygen. Note that the plasma treatment was successively performed in the same process chamber as that used for the deposition of the gate insulating film 105. As described above, the conditions of the plasma treatment were set in such a manner that less nitrogen was mixed into the seed crystal 107 in Sample C than in Samples A and B.

The plasma treatment on the gate insulating film 105 of each of Samples A and B was performed in the following manner: dinitrogen monoxide was introduced into the process chamber at a flow rate of 400 sccm, the pressure in the process chamber was 60 Pa, the RF power source frequency was 13.56 MHz, the power of the RF power source was 300 W, and the plasma discharge was performed for three minutes. Note that in the plasma treatment, a parallel plate plasma treatment apparatus was used, the temperature of an upper electrode was 200° C., the temperature of a lower electrode was 300° C., the distance between the upper electrode and the lower electrode was 15 mm.

The plasma treatment on the gate insulating film 105 of Sample C was performed in the following manner: hydrogen and oxygen were introduced into a process chamber at flow rates of 800 sccm and 200 sccm, respectively, the pressure in the process chamber was 1250 Pa, the RF power source frequency was 13.56 MHz, the power of the RF power source was 900 W, and the plasma discharge was performed for three minutes. Note that in the plasma treatment, a parallel plate plasma treatment apparatus was used, the temperature of an upper electrode was 200° C., the temperature of a lower electrode was 300° C., the distance between the upper electrode and the lower electrode was 15 mm.

Then, the seed crystal 107 having a thickness of 5 nm was formed by a plasma CVD method over the gate insulating film 105. Here, the seed crystal 107 of Sample A was formed in the same process chamber as that used for the deposition of the gate insulating film 105 and the plasma treatment; the seed crystal 107 of each of Samples B and C was formed in a process chamber different from the chamber used for the deposition of the gate insulating film 105 and the plasma treatment. In this manner, the conditions of formation of the seed crystals were set in such a manner that less nitrogen was mixed into the seed crystals 107 in Samples B and C than in Sample A. Note that other conditions of formation of the seed crystal 107 were similar between Samples A to C.

In the deposition of the seed crystal of each of Samples A to C, silane, hydrogen, and argon were introduced as a source gas at flow rates of 2 sccm, 750 sccm, and 750 sccm, respectively; the pressure in the process chamber was 1250 Pa; the RF power source frequency was 13.56 MHz; the power of the RF power source was 100 W; and plasma discharge was performed. Note that in the deposition of the seed crystal 107, a parallel plate plasma CVD apparatus was used, the temperature of an upper electrode was 200° C., the temperature of a lower electrode was 300° C., and the distance between the upper electrode and the lower electrode was 7 mm.

The structure obtained through the steps up to here is illustrated in FIG. 9A.

Then, the microcrystalline semiconductor film 108 having a thickness of 65 nm was formed over the gate insulating film 105 and the seed crystal 107 by a plasma CVD method. In the deposition of the microcrystalline semiconductor film 108, silane, hydrogen, and argon were introduced as a source gas at flow rates of 1.5 sccm, 750 sccm, and 750 sccm, respectively; the pressure in a process chamber was 10000 Pa; the RF power source frequency was 13.56 MHz; the power of the RF power source was 300 W; and plasma discharge was performed. Note that in the deposition of the microcrystalline semiconductor film 108, a parallel plate plasma CVD apparatus was used, the temperature of an upper electrode was 200° C., the temperature of a lower electrode was 300° C., and the distance between the upper electrode and the lower electrode was 7 mm.

The structure obtained through the steps up to here is illustrated in FIG. 9B.

Then, the semiconductor film 111 having a thickness of 80 nm was formed over the microcrystalline semiconductor film 108, and the impurity semiconductor film 113 having a thickness of 50 nm was formed over the semiconductor film 111. The semiconductor film 111 and the impurity semiconductor film 113 were formed by a plasma CVD method.

In the deposition of the semiconductor film 111, silane, 1000 ppm ammonia (diluted with hydrogen), hydrogen, and argon were introduced as a source gas at flow rates of 25 sccm, 100 sccm, 650 sccm, and 750 sccm, respectively; the pressure in a process chamber was 1250 Pa; the RF power source frequency was 13.56 MHz; the power of the RF power source was 150 W; and plasma discharge was performed. Note that in the deposition of the semiconductor film 111, a parallel plate plasma CVD apparatus was used, the temperature of an upper electrode was 200° C., the temperature of a lower electrode was 300° C., and the distance between the upper electrode and the lower electrode was 15 mm.

As the impurity semiconductor film 113, an amorphous silicon film to which phosphorus was added was formed. In the deposition of the impurity semiconductor film 113, silane, 5% phosphine (diluted with silane), and hydrogen were introduced as a source gas at flow rates of 90 sccm, 10 sccm, and 500 sccm, respectively; the pressure in a process chamber was 170 Pa; the RF power source frequency was 13.56 MHz; the power of the RF power source was 30 W; and plasma discharge was performed. Note that in the deposition of the impurity semiconductor film, a parallel plate plasma CVD apparatus was used, the temperature of an upper electrode was 200° C., the temperature of a lower electrode was 300° C., and the distance between the upper electrode and the lower electrode was 25 mm.

After that, a resist was applied over the impurity semiconductor film 113, irradiated with light using a second photomask, and developed to form the mask 115 formed of a resist. The structure obtained through the steps up to here is illustrated in FIG. 3B.

Then, the microcrystalline semiconductor film 108, the semiconductor film 111, and the impurity semiconductor film 113 were etched using the mask 115 formed of a resist, whereby the semiconductor stacked body 117 including the microcrystalline semiconductor region 117a and the amorphous semiconductor region 117b, and the impurity semiconductor film 121 were formed.

In this example, the etching of the microcrystalline semiconductor film 108, the semiconductor film 111, and the impurity semiconductor film 113 was performed with an ICP apparatus under the following condition: the ICP power was 450 W; the bias power was 100 W; boron trichloride, carbon tetrafluoride, and oxygen were introduced as an etching gas at flow rates of 36 sccm, 36 sccm, and 8 sccm, respectively; and the pressure in a process chamber was 2 Pa.

Then, oxygen plasma treatment was performed, whereby an oxide film was formed on side surfaces of the impurity semiconductor film 121 and the semiconductor stacked body 117 including the microcrystalline semiconductor region 117a and the amorphous semiconductor region 117b. After that, the mask 115 formed of a resist was removed (not illustrated).

In the oxygen plasma treatment, oxygen was introduced at a flow rate of 100 sccm, the pressure in a process chamber was 0.67 Pa, the substrate temperature was −10° C., the source power was 2000 W, the bias power was 350 W, and plasma discharge was performed.

The structure obtained through the steps up to here is illustrated in FIG. 3C.

Next, the conductive film 127 was formed to cover the gate insulating film 105, the semiconductor stacked body 117, and the impurity semiconductor film 121. The structure obtained by this step is illustrated in FIG. 5A.

In this example, the conductive film 127 had a structure in which an aluminum layer was sandwiched between titanium layers and was formed in a manner similar to that of the gate electrode 103. Note that the thicknesses of the first titanium film, the aluminum film, and the second titanium film were 50 nm, 200 nm, and 50 nm, respectively.

After that, a resist was applied over the conductive film 127, irradiated with light using a third photomask, and developed to form a mask formed of a resist. Dry etching was performed on the conductive film 127 and the impurity semiconductor film 121 using the mask formed of a resist, whereby the wirings 129a and 129b and the impurity semiconductor films 131a and 131b which serve as the source and drain regions were formed.

In this step, the etching was performed with an ICP apparatus under the following condition: the ICP power was 450 W; the bias power was 100 W; boron trichloride and chlorine were introduced as an etching gas at flow rates of 60 sccm and 20 sccm, respectively; and the pressure in a process chamber was 1.9 Pa.

Further, the semiconductor stacked body 117 was partly etched after the mask formed of a resist was removed to form the semiconductor stacked body 133 including the microcrystalline semiconductor region 133a and the pair of amorphous semiconductor regions 133b.

In this step, the etching was performed with an ICP apparatus under the following condition: the ICP power was 500 W; the bias power was 50 W; hydrogen bromide, sulfur hexafluoride, and oxygen were introduced as an etching gas at flow rates of 125 sccm, 10 sccm, and 5 sccm, respectively; and the pressure in a process chamber was 1.7 Pa.

In this step, the etching was performed to make the thickness of the microcrystalline semiconductor region 133a be 50 nm. Note that in this example, the wirings 129a and 129b serving as a source electrode and a drain electrode had a straight line shape in a plane view.

Then, a surface of the semiconductor stacked body 133 was subjected to water plasma treatment, whereby impurities remaining on the surface of the semiconductor stacked body 133 were removed. In this step, the water plasma treatment was performed under the following condition: the power was 1800 W; water vapor was introduced at a flow rate of 300 sccm; and the pressure in a process chamber was 66.5 Pa.

The structure obtained through the steps up to here is illustrated in FIG. 5B.

Next, a 300-nm-thick silicon nitride film was formed as the insulating film 137. In the deposition of the insulating film 137, silane, ammonia, nitrogen, and hydrogen were introduced as a source gas at flow rates of 20 sccm, 220 sccm, 450 sccm, and 450 sccm, respectively; the pressure in a process chamber was 160 Pa; the RF power source frequency was 27 MHz; the power of the RF power source was 200 W; and plasma discharge was performed. Note that in the deposition of the insulating film 137, a parallel plate plasma CVD apparatus was used, the temperature of an upper electrode was 250° C., the temperature of a lower electrode was 290° C., and the distance between the upper electrode and the lower electrode was 21 mm.

After that, a resist was applied over the insulating film 137, irradiated with light using a fourth photomask, and developed to form a mask formed of a resist. Using the mask formed of a resist, part of the insulating film was dry etched to expose the wirings 129a and 129b serving as the source and drain electrodes. In addition, part of the insulating film 137 and part of the gate insulating film 105 were dry etched to expose the gate electrode 103. After that, the mask formed of a resist was removed.

After that, a conductive film was formed over the insulating film 137. Then, a resist was applied over the conductive film, irradiated with light using a fifth photomask, and developed to form a mask formed of a resist. Using the mask formed of a resist, part of the conductive film was wet etched to form the back gate electrode 139.

In this example, as the conductive film, a 50-nm-thick indium tin oxide was formed by a sputtering method and then was wet etched to form the back gate electrode 139. Although not illustrated, the back gate electrode 139 was connected to the gate electrode 103. After that, the mask formed of a resist was removed.

Through the above process, Samples A to C that are dual-gate thin film transistors were formed (see FIG. 5C).

Next, results of a bias-temperature stress test (hereinafter referred to as a "gate BT test") performed on Samples A to C which were manufactured are described.

Here, the gate BT test is one of accelerated tests and can evaluate change in characteristics caused by long-term usage, of transistors in a short time. In particular, the amount of change in threshold voltage and a shift value of a transistor between before and after the gate BT test is an important indicator for examining the reliability. Between before and after the gate BT test, a smaller amount of change in threshold voltage (Vth [V]) and a shift value (Shift [V]) means higher reliability.

Figure 11A:
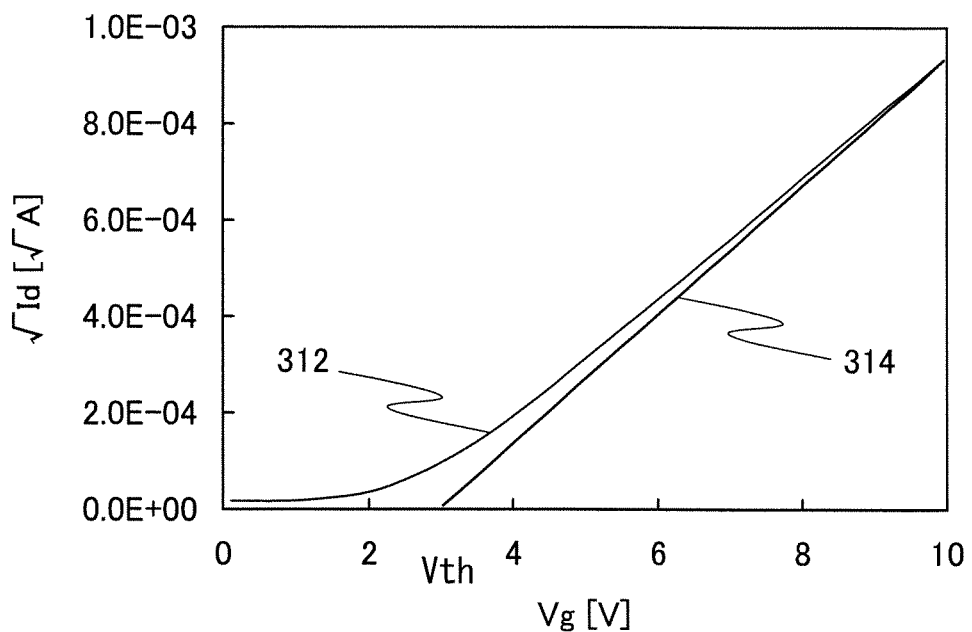
FIGS. 11A and 11B show definition of threshold voltage of a transistor and a shift value of a transistor, respectively.

In this specification, in a curve 312 where the horizontal axis and the vertical axis indicate the gate voltage (Vg [V]) and the square root of drain current ($Id^{1/2}$ [$A^{1/2}$])$_5$ respectively, the threshold voltage Vth is defined as gate voltage at a point of intersection of an extrapolated tangent line 314 of $Id^{1/2}$ having the highest inclination with the Vg axis (i.e., $d^{1/2}$ of 0 $A^{1/2}$) (see FIG. 11A). Note that in this specification, threshold voltage is calculated with a drain voltage Vd of 10 V.

Figure 11B:
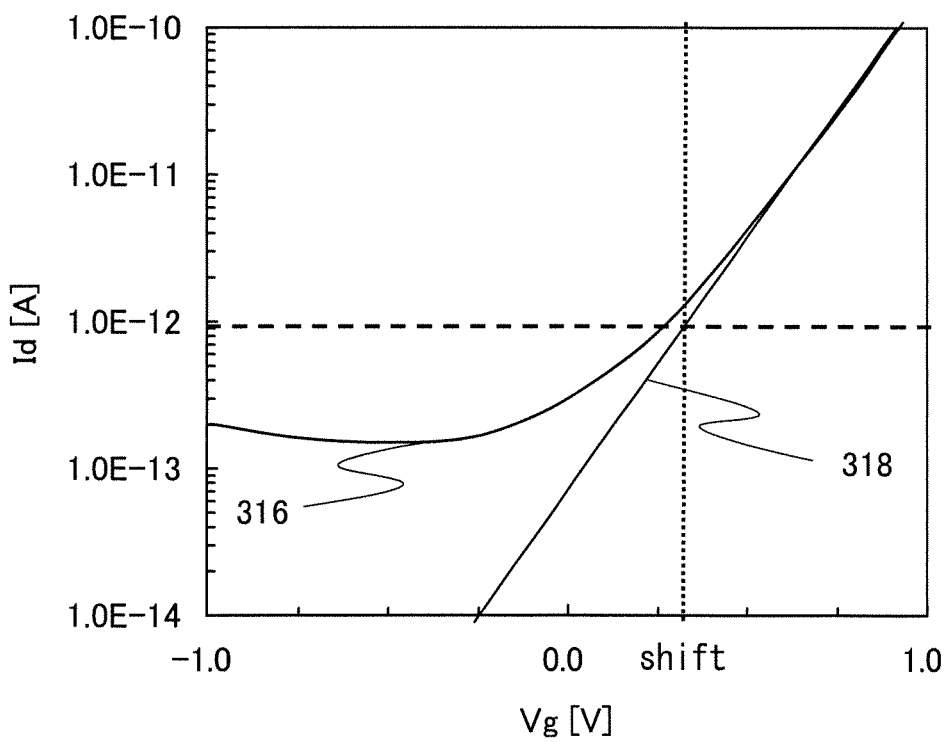

In this specification, in a curve 316 where the horizontal axis and the vertical axis indicate the gate voltage (Vg [V]) and the logarithm of drain current (Id [A]), respectively, the shift value Shift is defined as gate voltage at a point of intersection of an extrapolated tangent line 318 of Id having the highest inclination with a straight line of Id=1.0×10$^{-12}$ [A] (see FIG. 11B). Note that in this specification, a shift value is calculated with a drain voltage Vd of 10 V.

A specific method of a gate BT test is as follows: the temperature of a substrate over which a transistor is formed (substrate temperature) is set at fixed temperature, the potentials of a source and a drain of the transistor are set to be almost equal, and a gate is supplied with a potential different from those of the source and the drain for a certain period. The substrate temperature may be set as appropriate in accordance with the purpose of the test. Note that the test in the case where bias stress is applied in such a manner that the potential applied to the gate is higher than the potentials of the source and the drain is referred to as a positive gate BT test, and the test in the case where bias stress is applied in such a manner that the potential applied to the gate is lower than the potentials of the source and the drain is referred to as a negative gate BT test.

In this example, a positive gate BT test and a negative gate BT test were performed on Samples A to C with a substrate temperature of 85° C. and a stress time of 12 hours.

First, the positive gate BT test is described. In order to measure initial characteristics of the transistors subjected to the gate BT test, change in characteristics of the source-drain current (hereinafter referred to as the drain current) was measured under a condition where the substrate temperature was set to room temperature, the voltage between the source and the drain (hereinafter, referred to as the drain voltage) was set to 1 V or 10 V, and the voltage between the source and the gate (hereinafter, referred to as the gate voltage) was changed in the range of −30 V to +30 V. That is, Vg-Id characteristics of Samples A to C at drain voltages of 1 V and 10 V were measured.

Next, the substrate temperature was increased to 85° C., and then, the potential of the source of the transistor was set to a ground potential and the potential of the drain was set to 0.1 V. Then, +20 V was kept being applied to the gate for 12 hours, so that bias stress and heat stress were applied to Samples A to C. After that, Vg-Id characteristics were measured under the same condition as the measurement of the initial characteristics.

The negative gate BT test was performed similarly to the positive gate BT test. Note that in the negative gate BT test, −20 V was kept being applied to the gate for 12 hours, so that bias stress and heat stress were applied.

Figure 12A:
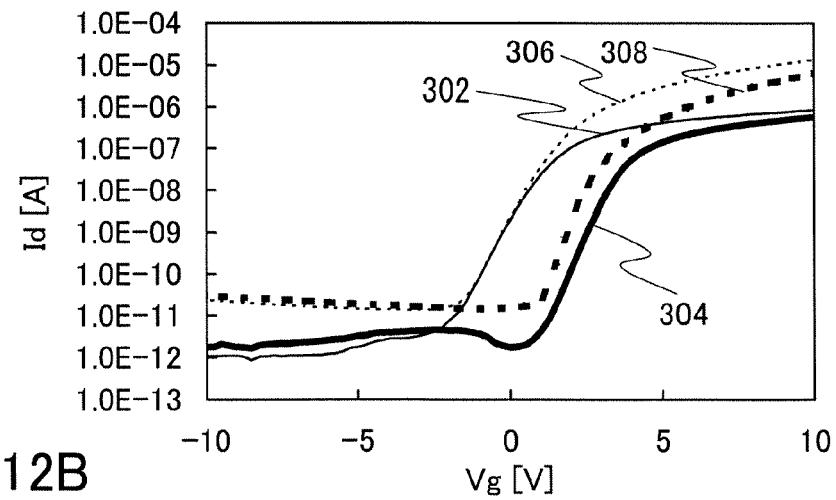
FIGS. 12A to 12C show Vg-Id characteristics of Samples A to C before and after a positive gate BT test.
Figure 12B:
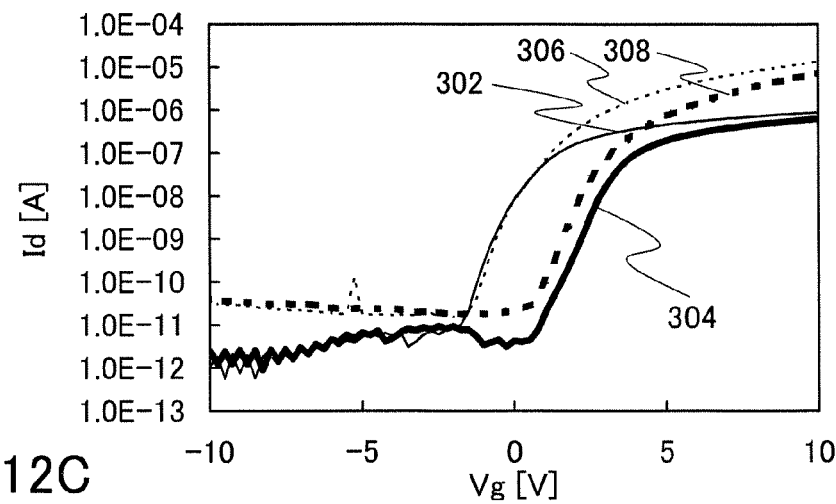
Figure 12C:
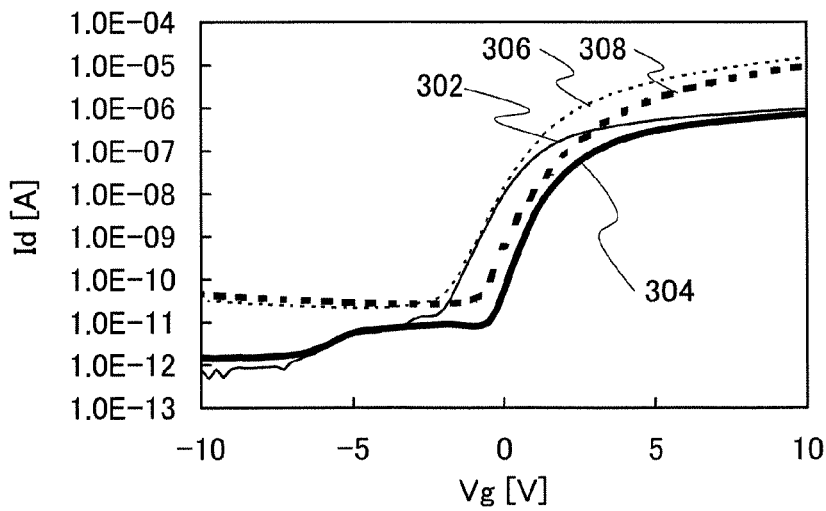
Figure 13A:
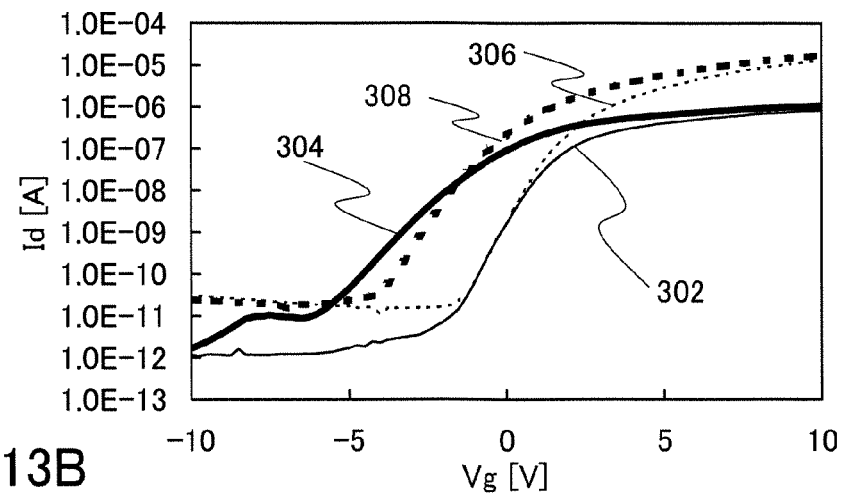
FIGS. 13A to 13C show Vg-Id characteristics of Samples A to C before and after a negative gate BT test.
Figure 13B:
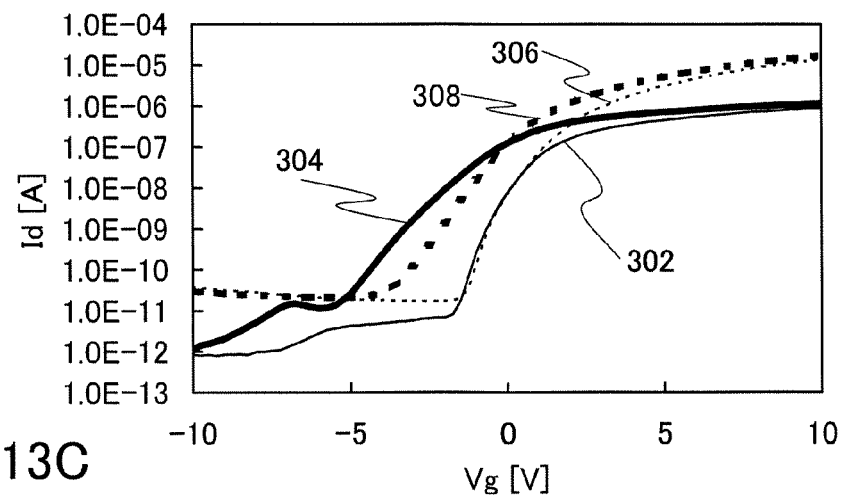
Figure 13C:
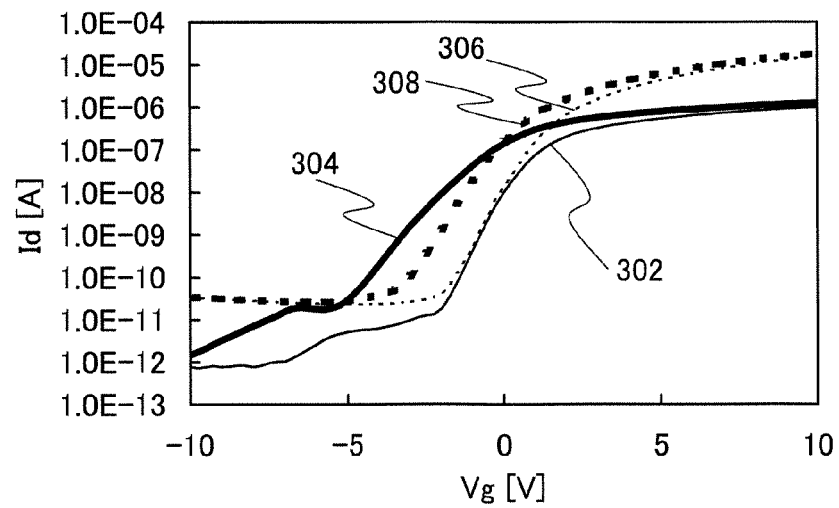

The Vg-Id characteristics which were measured in the positive gate BT test performed on Samples A, B, and C are shown in FIGS. 12A, 12B, and 12C, respectively; the Vg-Id characteristics which were measured in the negative gate BT test performed on Samples A, B, and C are shown in FIGS. 13A, 13B, and 13C, respectively. In each of FIGS. 12A to 12C and FIGS. 13A to 13C, the vertical axis indicates drain current (Id [A]) and the horizontal axis indicates gate voltage (Vg [V]). Further, a curve 302 shows initial characteristics with a drain voltage of 1 V; a curve 304 shows the Vg-Id characteristics after the gate BT test with a drain voltage of 1 V; a curve 306 shows initial characteristics with a drain voltage of 10 V; and a curve 308 shows the Vg-Id characteristics after the gate BT test with a drain voltage of 10 V.

From FIGS. 12A to 12C, it can be observed that change in the Vg-Id characteristics between before and after the gate BT test tends to be smaller in Sample B than in Sample A and tends to be smaller in Sample C than in Sample B. Especially in Sample C, change in the Vg-Id characteristics between before and after the gate BT test is suppressed to be small as compared to those in Samples A and B. Further, similar tendency can be observed from FIGS. 13A to 13C. That is, it can be assumed that Sample B is superior to Sample A and Sample C is superior to Samples A and B, in the reliability of the thin film transistor.

Figure 14:
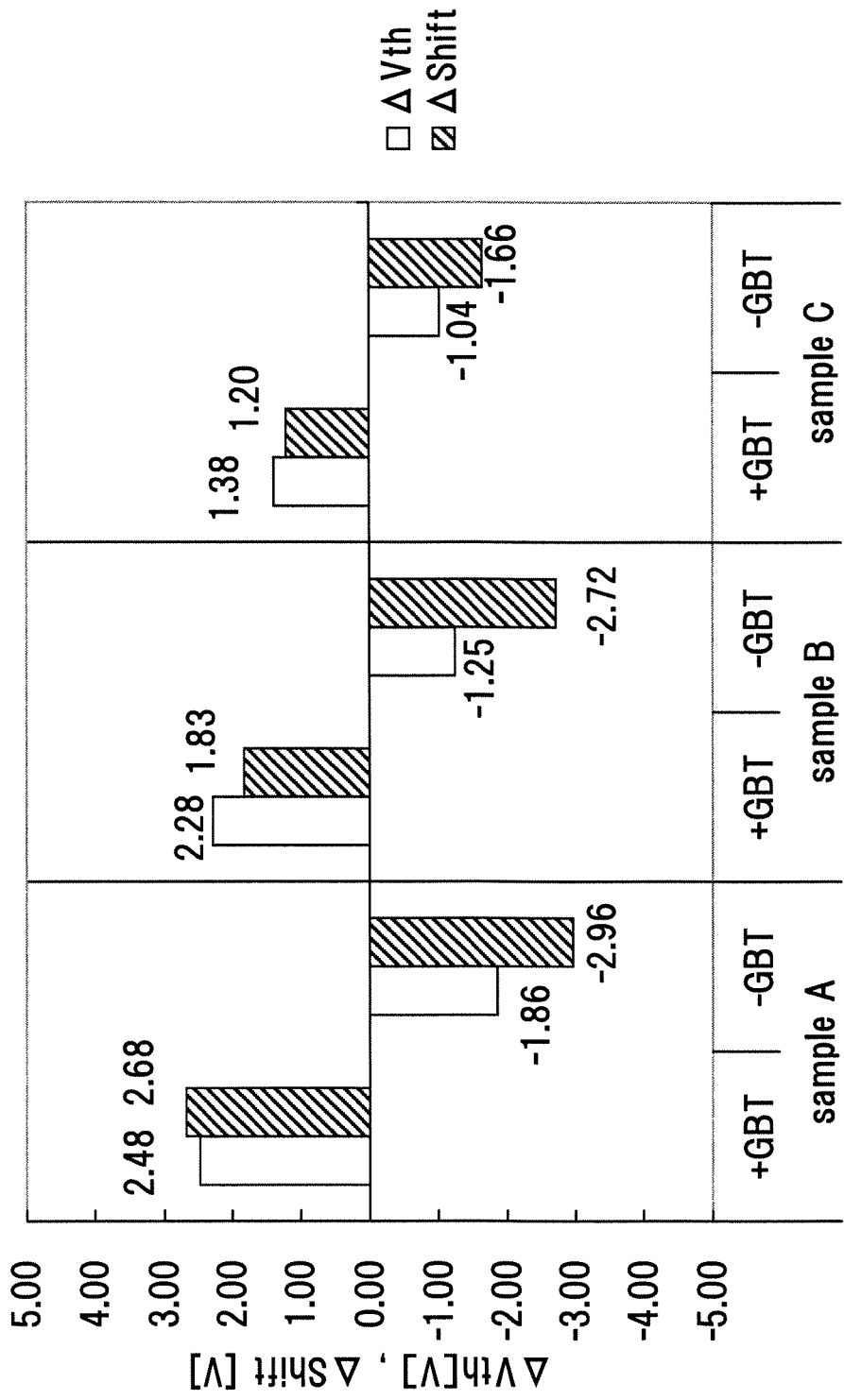
FIG. 14 shows the amount of change in threshold voltage and a shift value of Samples A to C.

Here, FIG. 14 is a graph showing the amount of change (ΔVth) in the threshold voltage and the amount of change (ΔShift) in the shift value between before and after the gate BT test which were calculated from the Vg-Id characteristics of Samples A to C which are shown in FIGS. 12A to 12C and FIGS. 13A to 13C with the drain voltage of 10V.

From FIG. 14, it can be observed that the amount of change in the threshold voltage and the amount of change in the shift value in the positive gate BT test and the negative gate BT test are smaller in Sample B than in Sample A and are smaller in Sample C than in Sample B. Thus, it was confirmed that Sample B is superior to Sample A and Sample C is superior to Samples A and B, in the reliability of the thin film transistor.

Here, Samples A and B are different from Sample C in the condition of the plasma treatment performed on the gate insulating film 105; the plasma treatment on Samples A and B was performed in a dinitrogen monoxide ($N_2O$) atmosphere and the plasma treatment on Sample C was performed in a mixed atmosphere of hydrogen and oxygen. In other words, the formation conditions were set in such a manner that less nitrogen was mixed into the seed crystal 107 and the microcrystalline semiconductor region 133a in Sample C than in Samples A and B.

Here, Sample A is different from Samples B and C in the formation condition of the seed crystal 107. The seed crystal 107 of Sample A was formed in the same process chamber as that used for the deposition of the gate insulating film 105 and the plasma treatment; on the other hand, the seed crystal 107 of each of Samples B and C was formed in a process chamber different from the process chamber used for the deposition of the gate insulating film 105 and the plasma treatment. In other words, the formation conditions were set in such a manner that less nitrogen was mixed into the seed crystal 107 and the microcrystalline semiconductor region 133a in Samples B and C than in Sample A.

That is, the formation conditions were set in such a manner that less nitrogen was mixed into the microcrystalline semiconductor region in Sample B than in Sample A, and that less nitrogen was mixed into the microcrystalline semiconductor region in Sample C than in Samples A and B.

As described above, it was shown that the amount of change in threshold voltage and the amount of change in a shift value between before and after a gate BT test can be reduced and the reliability of a thin film transistor can be thus improved when the thin film transistor is manufactured under a condition where nitrogen is less likely to be mixed into a microcrystalline semiconductor region.

Example 2

In this example, structures (Samples D and E), in each of which an insulating film 401, a microcrystalline semiconductor film 403, a semiconductor film 404, and an impurity semiconductor film 405 were stacked in that order, were deposited under different manufacturing conditions, and measurement results of SIMS profiles of Samples D and E are described.

First, methods for manufacturing Samples D and E are described. Sample D was formed by successively depositing the insulating film 401, the microcrystalline semiconductor film 403, the semiconductor film 404, and the impurity semiconductor film 405 in the same process chamber. On the other hand, in the deposition process of the insulating film 401, the microcrystalline semiconductor film 403, the semiconductor film 404, and the impurity semiconductor film 405 of Sample E, cleaning of the process chamber and deposition of a protective film on an inner wall of the process chamber were performed every time one of the films was deposited. Further, the microcrystalline semiconductor film 403 of Sample E was deposited by the method described in Embodiment 4.

First, the insulating film 401 was deposited. In this example, a 300-nm-thick silicon nitride film was formed by a plasma CVD method as the insulating film 401. The deposition of the silicon nitride film was performed under a condition similar to that of the silicon nitride film formed as the gate insulating film 105 in Example 1.

After that, plasma treatment was performed on the insulating film 401 in a dinitrogen monoxide ($N_2O$) atmosphere. Note that the above plasma CVD and the plasma treatment here were successively performed in the process chamber in which the insulating film 401 was formed.

The plasma treatment performed on the insulating film 401 was dinitrogen monoxide plasma treatment using a condition similar to that of the plasma treatment performed on the gate insulating film 105 of Samples A and B which is described in Example 1.

Further, in Sample E, cleaning of the process chamber was performed. The cleaning of the process chamber was performed in such a manner that $NF_3$ was introduced at a flow rate of 500 sccm, the RF power source frequency was 13.56 MHz, and the power of the RF power source was 500 W. Note that a parallel plate plasma CVD apparatus was used, the temperature of an upper electrode was 200° C., the temperature of a lower electrode was 300° C., and the distance between the upper electrode and the lower electrode was 50 mm at the beginning of the plasma treatment and was enlarged to 70 mm during the plasma treatment.

Then, an amorphous silicon film was deposited as a protective film on the inner wall of the process chamber used for formation of Sample E. The protective film was deposited in such a manner that $SiH_4$ was introduced at a flow rate of 60 sccm, the pressure in the process chamber was 28 Pa, the RF power source frequency was 13.56 MHz, the power of the RF power source was 30 W, and plasma discharge was performed. Note that a parallel plate plasma CVD apparatus was used, the temperature of an upper electrode was 200° C., the temperature of a lower electrode was 300° C., and the distance between the upper electrode and the lower electrode was 25 mm.

Subsequently, the microcrystalline semiconductor film 403 with a thickness of 30 nm was deposited over the insulating film 401 by a plasma CVD method.

In Sample D, the microcrystalline semiconductor film 403 with a thickness of 30 nm was formed over the insulating film 401 by a plasma CVD method. In the deposition of the microcrystalline semiconductor film 403, silane, hydrogen, and argon were introduced as a source gas at flow rates of 2.5 sccm, 750 sccm, and 750 sccm, respectively; the pressure in a process chamber was 1250 Pa; the RF power source frequency was 13.56 MHz; the power of the RF power source was 120 W; and plasma discharge was performed. Note that in the deposition of the microcrystalline semiconductor film 403, a parallel plate plasma CVD apparatus was used, the temperature of an upper electrode was 200° C., the temperature of a lower electrode was 300° C., and the distance between the upper electrode and the lower electrode was 7 mm.

The microcrystalline semiconductor film 403 of Sample E had a structure in which a microcrystalline semiconductor film with a thickness of 25 nm was stacked over a seed crystal with a thickness of 5 nm.

In Sample E, first, the seed crystal with a thickness of 5 nm was formed over the insulating film 401 by a plasma CVD method. In the deposition of the seed crystal, silane, hydrogen, and argon were introduced as a source gas at flow rates of 2.5 sccm, 750 sccm, and 750 sccm, respectively; the pressure in the process chamber was 1250 Pa; the RF power source frequency was 13.56 MHz; the power of the RF power source was 150 W; and plasma discharge was performed. Note that in the deposition of the seed crystal, a parallel plate plasma CVD apparatus was used, the temperature of an upper electrode was 200° C., the temperature of a lower electrode was 300° C., and the distance between the upper electrode and the lower electrode was 11 mm.

Then, the microcrystalline semiconductor film with a thickness of 25 nm was formed over the seed crystal by a plasma CVD method. In the deposition of the microcrystalline semiconductor film, silane, hydrogen, and argon were introduced as a source gas at flow rates of 2.5 sccm, 750 sccm, and 750 sccm, respectively; the pressure in the process chamber was 10000 Pa; the RF power source frequency was 13.56 MHz; the power of the RF power source was 300 W; and plasma discharge was performed. Note that in the deposition of the microcrystalline semiconductor film, a parallel plate plasma CVD apparatus was used, the temperature of an upper electrode was 200° C., the temperature of a lower electrode was 300° C., and the distance between the upper electrode and the lower electrode was 7 mm.

Further, the process chamber for Sample E was cleaned and a protective film was deposited on the inner wall thereof, in a method similar to the above-described method.

Then, the semiconductor film 404 with a thickness of 175 nm was formed over the microcrystalline semiconductor film 403. The semiconductor film 404 was formed by a plasma CVD method. The deposition of the semiconductor film 404 was performed under a condition similar to that of the semiconductor film 111 described in Example 1.

Note that the semiconductor film 404 had a structure in which the amorphous semiconductor region 133b was stacked over the microcrystalline semiconductor region 133e containing nitrogen as illustrated in FIG. 2A. Thus, in the semiconductor film 404, a microcrystalline semiconductor region was formed on the microcrystalline semiconductor film 403 side.

Further, the process chamber for Sample E was cleaned and a protective film was deposited on the inner wall thereof, in a method similar to the above-described method.

The impurity semiconductor film 405 with a thickness of 50 nm was formed over the semiconductor film 404. The impurity semiconductor film 405 was formed by a plasma CVD method. As the impurity semiconductor film 405, an amorphous silicon film to which phosphorus was added was formed. The deposition of the impurity semiconductor film 405 was performed under a condition similar to that of the impurity semiconductor film 113 described in Example 1.

Further, the process chamber for Sample E was cleaned and a protective film was deposited on the inner wall thereof, in a method similar to the above-described method.

Through the above process, Samples D and E, in each of which the insulating film 401, the microcrystalline semiconductor film 403, the semiconductor film 404, the impurity semiconductor film 405 were stacked in that order, were manufactured.

Next, the measurement results of the SIMS profiles of Samples D and E which were manufactured are described with reference to FIG. 15 and FIG. 16.

Figure 15:
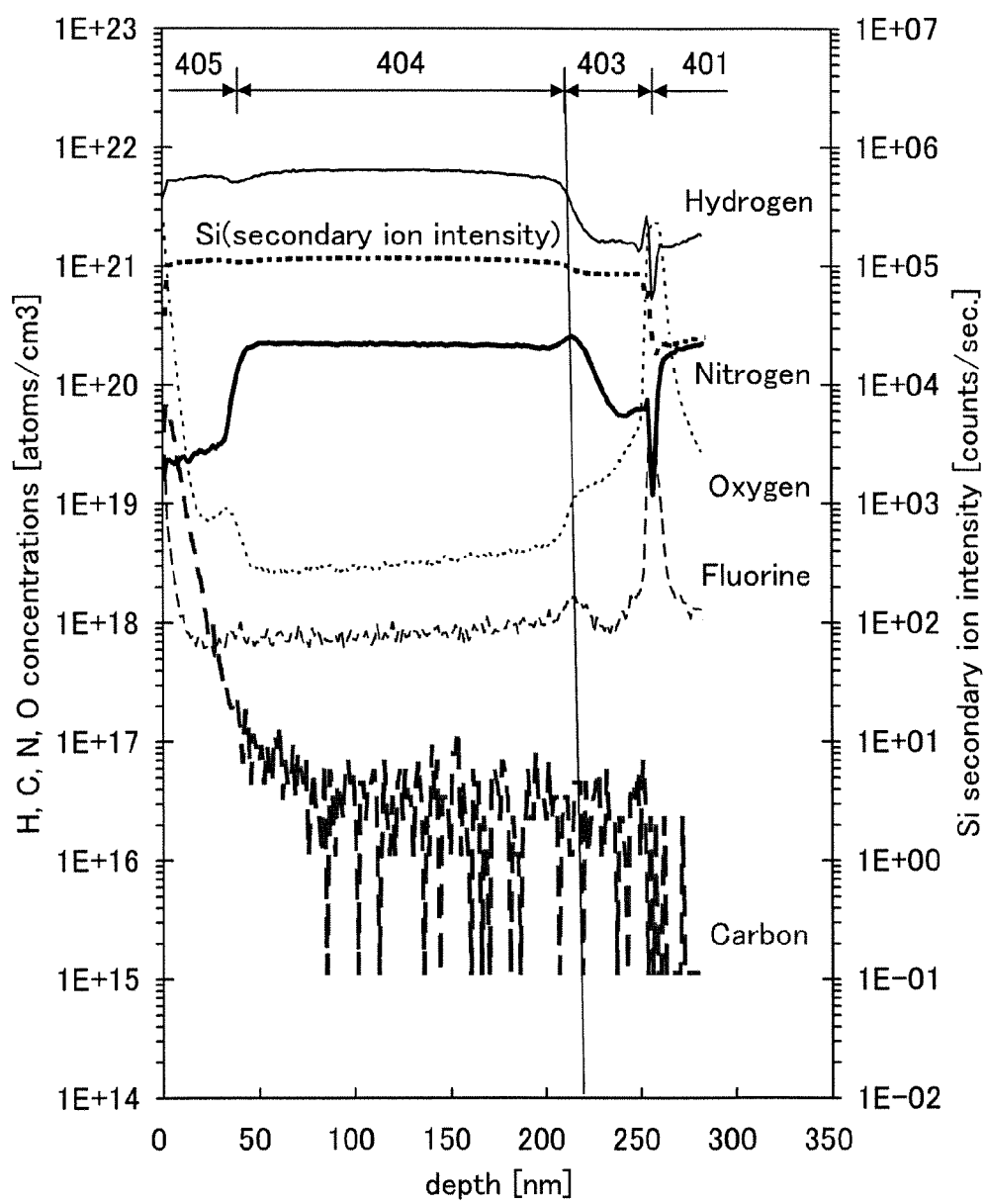
FIG. 15 shows measurement results by SIMS of Sample D.

FIG. 15 shows the secondary ion intensity of silicon and the concentration profiles of distributions of hydrogen, nitrogen, oxygen, carbon, and fluorine in a depth direction, which were measured by SIMS, of Sample D; FIG. 16 shows those of Sample E.

Here, SIMS measurement was performed by using a PHI ADEPT-1010 quadrupole SIMS instrument manufactured by ULVAC-PHI, Incorporated. In addition, irradiation with Cs−, as primary ions, was performed with an acceleration voltage of 3 kV. Further, the surface irradiated with the primary ions was on the impurity semiconductor film 405 side.

Figure 16:
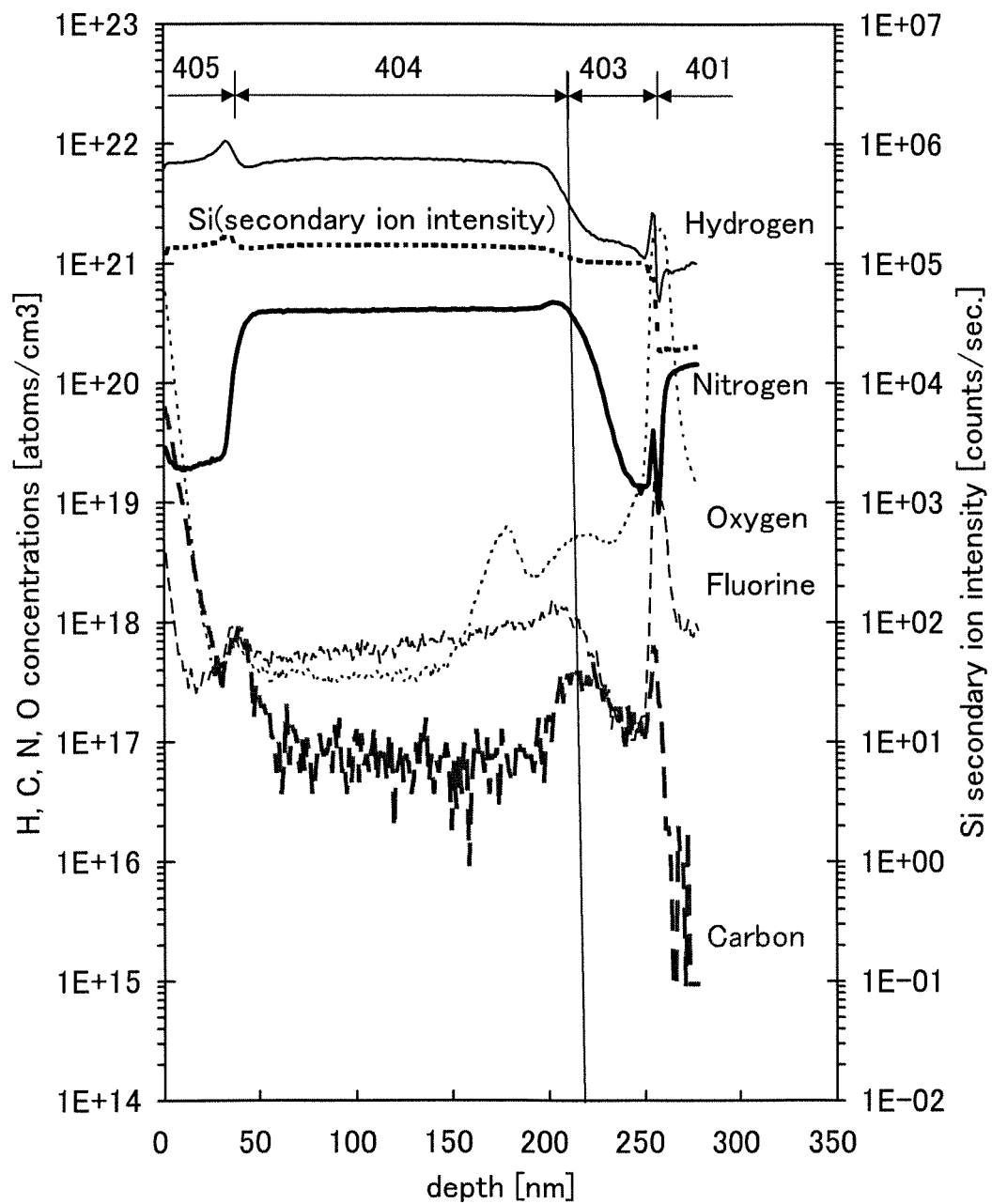
FIG. 16 shows measurement results by SIMS of Sample E.

In FIG. 15 and FIG. 16, the horizontal axis indicates a depth with a surface of the impurity semiconductor film 405 as a reference. Further, the vertical axis on the left side indicates the concentrations of hydrogen, nitrogen, oxygen, carbon, and fluorine, and the vertical axis on the right side indicates the secondary ion intensity of silicon. Note that the concentrations in the interface between the insulating film 401 and the microcrystalline semiconductor film 403 are not accurately shown.

The profile of the nitrogen concentration in the microcrystalline semiconductor film 403 of Sample D shows a concentration of approximately $6 \times 10^{19}$ atoms/cm$^3$ and the concentration increases toward the interface with the semiconductor film 404.

On the other hand, the profile of the nitrogen concentration in the microcrystalline semiconductor film 403 of Sample E shows a concentration of approximately $1 \times 10^{19}$ atoms/cm$^3$ and the concentration increases toward the interface with the semiconductor film 404.

Further, the nitrogen concentration profile of Sample D marks a peak concentration in the interface between the microcrystalline semiconductor film 403 and the semiconductor film 404, and the nitrogen concentration profile of Sample E marks a peak concentration in the semiconductor film 404. This is because the nitrogen concentration of the microcrystalline semiconductor region of the semiconductor film 404, which was formed at an early stage of the deposition, is high.

The nitrogen concentration of the microcrystalline semiconductor film 403 is lower in Sample E than in Sample D.

Thus, it was shown that the nitrogen concentration of the microcrystalline semiconductor film 403, specifically, the nitrogen concentration on the interface with the insulating film 401 side, can be reduced when cleaning of the process chamber and deposition of the protective film on the inner wall of the process chamber are performed every time one film is deposited.

Example 3

In this example, defects in a microcrystalline semiconductor film containing nitrogen were evaluated by an electron spin resonance (ESR) method.

First, a deposition condition of the microcrystalline semiconductor film is described.

As each of Samples F, G, and H, a 150-nm-thick microcrystalline semiconductor film was deposited over a quartz substrate.

The microcrystalline semiconductor film of Sample F was deposited in the following manner: a silicon nitride film was deposited in a process chamber of a plasma CVD apparatus; a microcrystalline silicon film was then deposited as a protective film in the process chamber; the quartz substrate was then transferred to the process chamber; and the microcrystalline semiconductor film was deposited over the quartz substrate.

The microcrystalline semiconductor film over the quartz substrate was formed in such a manner that a 5-nm-thick seed crystal formed of microcrystalline silicon was formed and then a 145-nm-thick microcrystalline silicon film was formed.

In the deposition of the seed crystal, silane, hydrogen, and argon were introduced as a source gas at flow rates of 3 sccm, 750 sccm, and 750 sccm, respectively; the pressure in the process chamber was 532 Pa; the RF power source frequency was 13.56 MHz; the power of the RF power source was 125 W; and plasma discharge was performed. Note that in the deposition of the seed crystal, a parallel plate plasma CVD apparatus was used, the temperature of an upper electrode was 200° C., the temperature of a lower electrode was 300° C., the distance between the upper electrode and the lower electrode was 15 mm.

In the deposition of the microcrystalline silicon film, silane and hydrogen were introduced as a source gas at flow rates of 1 sccm and 1500 sccm, respectively; the pressure in the process chamber was 5000 Pa; the RF power source frequency was 13.56 MHz; the power of the RF power source was 950 W; and plasma discharge was performed. Note that in the deposition of the microcrystalline silicon film, a parallel plate plasma CVD apparatus was used, the temperature of an upper electrode was 200° C., the temperature of a lower electrode was 300° C., the distance between the upper electrode and the lower electrode was 15 mm.

The microcrystalline semiconductor film of Sample G was deposited in the following manner: in a process chamber of a plasma CVD apparatus, an amorphous silicon film was deposited as a protective film and then a microcrystalline semiconductor silicon film was deposited as a protective film in the process chamber; the quartz substrate was then transferred to the process chamber; and the microcrystalline semiconductor film was deposited over the quartz substrate.

Similarly to Sample F, the microcrystalline semiconductor film over the quartz substrate was formed in such a manner that a 5-nm-thick seed crystal formed of microcrystalline silicon was formed and then a 145-nm-thick microcrystalline silicon film was formed. A deposition condition similar to the deposition condition for Sample F was used.

The microcrystalline semiconductor film of Sample H was deposited in the following manner: a silicon nitride film was deposited in a process chamber of a plasma CVD apparatus; the quartz substrate was then transferred to the process chamber; and the microcrystalline semiconductor film was deposited over the quartz substrate.

The deposition of the silicon nitride film was performed under a condition similar to that of the silicon nitride film used for the gate insulating film 105 in Example 1.

Similarly to Sample F, the microcrystalline semiconductor film over the quartz substrate was formed in such a manner that a 5-nm-thick seed crystal formed of microcrystalline silicon was formed and then a 145-nm-thick microcrystalline silicon film was formed. A deposition condition similar to the deposition condition for Sample F was used.

Subsequently, each of Samples F to H was then divided into pieces of 20 mm×3 mm. Analysis by an ESR method was performed with the three samples overlapped with each other. For the analysis by an ESR method, E500 CW-EPR spectrometer manufactured by Bruker BioSpin K.K. was used.

Figure 17A:
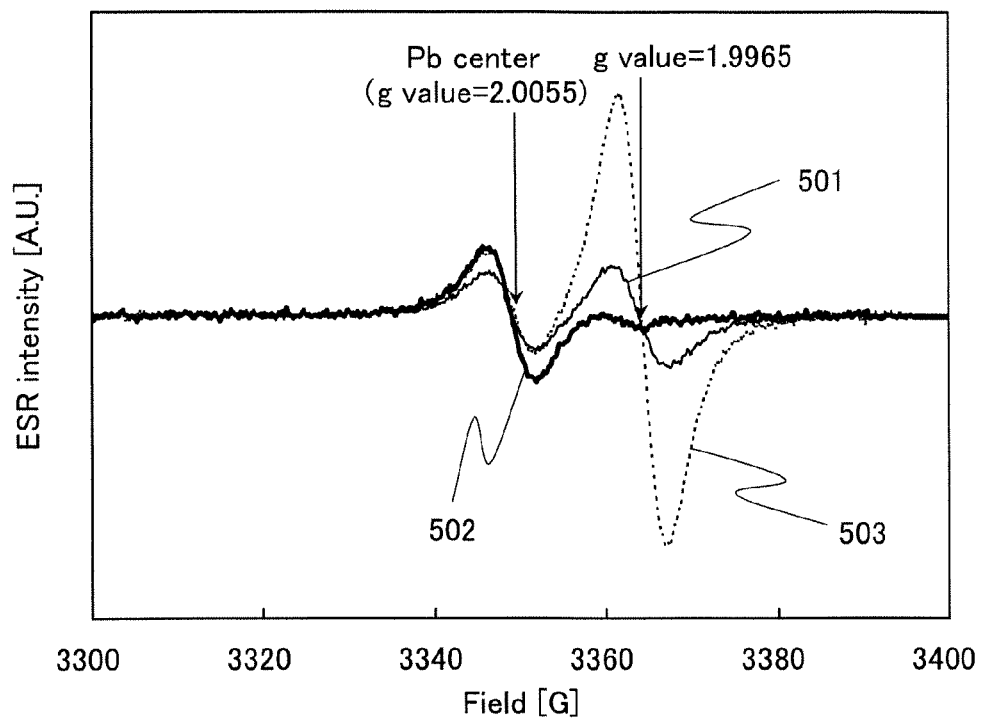
FIGS. 17A and 17B show ESR measurement results.
Figure 17B:
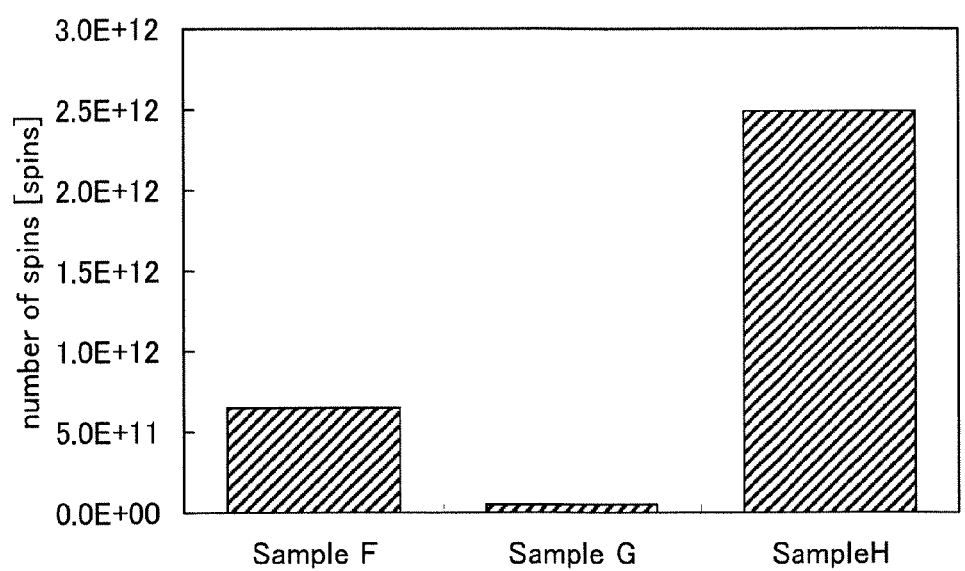

Measurement results of Samples F to H are shown in FIGS. 17A and 17B. A curve 501, a curve 502, and a curve 503 are a first derivative curve of Sample F, that of Sample G, and that of Sample H, respectively. Note that a horizontal axis with respect to the middle point of two peak points of the first derivative curve denotes the center of absorption (a resonance magnetic field). Note that in the ESR analysis, the measurement was performed in such a manner that the sample was irradiated with a microwave with a frequency of 9.456 GHz while a magnetic field was applied on the sample under a condition where the microwave electric power was 0.5 mW, modulation amplitude was 5 G, conversion time was 800 msec, the number of times of scanning was 2, and the measurement temperature was 10 K. Note that a g value depends on energy of the microwave with which the sample was irradiated and the intensity of the magnetic field applied on the sample.

As shown in FIG. 17A, a signal whose g value was 1.9965 was obtained in the curves 501 to 503. Further, a Pb center signal whose g value was 2.0055 was obtained. A Pb center signal is a signal showing a defect of silicon. The intensity of a signal whose g value was 1.9965 was higher in the curve 501 than in the curve 502 and was higher in the curve 503 than in the curve 501. In other words, as compared to the microcrystalline silicon film (Sample H) which was deposited in a state where the silicon nitride film was formed in the process chamber, the microcrystalline silicon film (Sample F) which was deposited in a state where the microcrystalline silicon film as the protective film was formed on a surface of the silicon nitride film shows lower intensity of the signal whose g value was 1.9965. Further, the microcrystalline silicon film (Sample G) which was deposited in a state where a silicon nitride film was not deposited and the amorphous silicon film and the microcrystalline silicon film were formed as the protective films in the process chamber shows lower intensity of the signal whose g value was 1.9965 than Sample F.

The number of spins of each of Samples F to H when the g value was 1.9965, which was calculated from an integral value of the curve in FIG. 17A is shown in FIG. 17B. It can be seen that the number of spins of each of Samples F and G is small and the number of spins of Sample H is large.

The intensity of the signal and the number of spins correspond to the amount of unpaired electrons in the microcrystalline silicon film. Thus, it can be seen that unpaired electrons, typically radicals and defects, in the microcrystalline silicon film can be reduced in the case where the microcrystalline silicon film is deposited in a process chamber in which a silicon nitride film is not exposed or in a process chamber in which no silicon nitride film is deposited.

Next, the amount of unpaired electrons before and after a gate BT test is described with reference to FIGS. 18A and 18B.

First, manufacturing conditions for samples are described.

Sample I was manufactured in the following manner. Indium tin oxide into which silicon oxide was mixed at 2% to 20% was deposited to a thickness of 50 nm as a first electrode over a quartz substrate. A 300-nm-thick silicon nitride film was deposited over the first electrode. Then, the silicon nitride film was exposed to plasma which was generated in a dinitrogen monoxide atmosphere. After that, a 30-nm-thick microcrystalline semiconductor film was deposited. Indium tin oxide into which silicon oxide was mixed at 2% to 20% was then deposited as a second electrode over the microcrystalline semiconductor film. Then, edge portions of the silicon nitride film, the microcrystalline semiconductor film, and the second electrode were etched, so that the first electrode was exposed.

In the deposition of the silicon nitride film, silane, hydrogen, ammonia, and nitrogen were introduced as a source gas at flow rates of 40 sccm, 550 sccm, 1400 sccm, and 500 sccm, respectively; the pressure in a process chamber was 100 Pa; the RF power source frequency was 13.56 MHz; the power of the RF power source was 200 W; and plasma discharge was performed. Note that in the deposition of the silicon nitride film, a parallel plate plasma CVD apparatus was used, the temperature of an upper electrode was 290° C., the temperature of a lower electrode was 250° C., the distance between the upper electrode and the lower electrode was 38 mm.

The exposure of the silicon nitride film to the plasma which was generated in the dinitrogen monoxide atmosphere was performed in the following manner: dinitrogen monoxide was introduced into a process chamber at a flow rate of 400 sccm, the pressure in the process chamber was 60 Pa, the RF power source frequency was 13.56 MHz, the power of the RF power source was 300 W, and plasma discharge was performed for three minutes. Note that in the plasma treatment, a parallel plate plasma treatment apparatus was used, the temperature of an upper electrode was 290° C., the temperature of a lower electrode was 250° C., the distance between the upper electrode and the lower electrode was 30 mm.

The microcrystalline semiconductor film over the silicon nitride film was formed in such a manner that a 5-nm-thick seed crystal formed of microcrystalline silicon was formed and then a 25-nm-thick microcrystalline silicon film was formed.

In the deposition of the seed crystal, silane, hydrogen, and argon were introduced as a source gas at flow rates of 4 sccm, 750 sccm, and 750 sccm, respectively; the pressure in a process chamber was 532 Pa; the RF power source frequency was 13.56 MHz; the power of the RF power source was 150 W; and plasma discharge was performed. Note that in the deposition of the seed crystal, a parallel plate plasma CVD apparatus was used, the temperature of an upper electrode was 290° C., the temperature of a lower electrode was 250° C., the distance between the upper electrode and the lower electrode was 15 mm.

In the deposition of the microcrystalline silicon film, silane, hydrogen, and argon were introduced as a source gas at flow rates of 1.8 sccm, 750 sccm, and 750 sccm, respectively; the pressure in a process chamber was 5000 Pa; the RF power source frequency was 13.56 MHz; the power of the RF power source was 125 W; and plasma discharge was performed. Note that in the deposition of the microcrystalline silicon film, a parallel plate plasma CVD apparatus was used, the temperature of an upper electrode was 290° C., the temperature of a lower electrode was 250° C., the distance between the upper electrode and the lower electrode was 15 mm.

Sample I which was subjected to the negative gate BT test is referred to as Sample J. In the negative gate BT test, a voltage of −18.4 V was kept being applied on the first and second electrodes for 48 hours in a state where the substrate temperature was 85° C.

Sample J in which defects in the microcrystalline silicon film were reduced by heating at 85° C. for 48 hours is referred to as Sample K.

Subsequently, each of Samples I to K was divided into pieces of 20 mm×3.3 mm. Analysis by an ESR method was performed with the two samples overlapped with each other. An apparatus for measurement and a measurement condition were similar to those for Samples F to H.

Figure 18A:
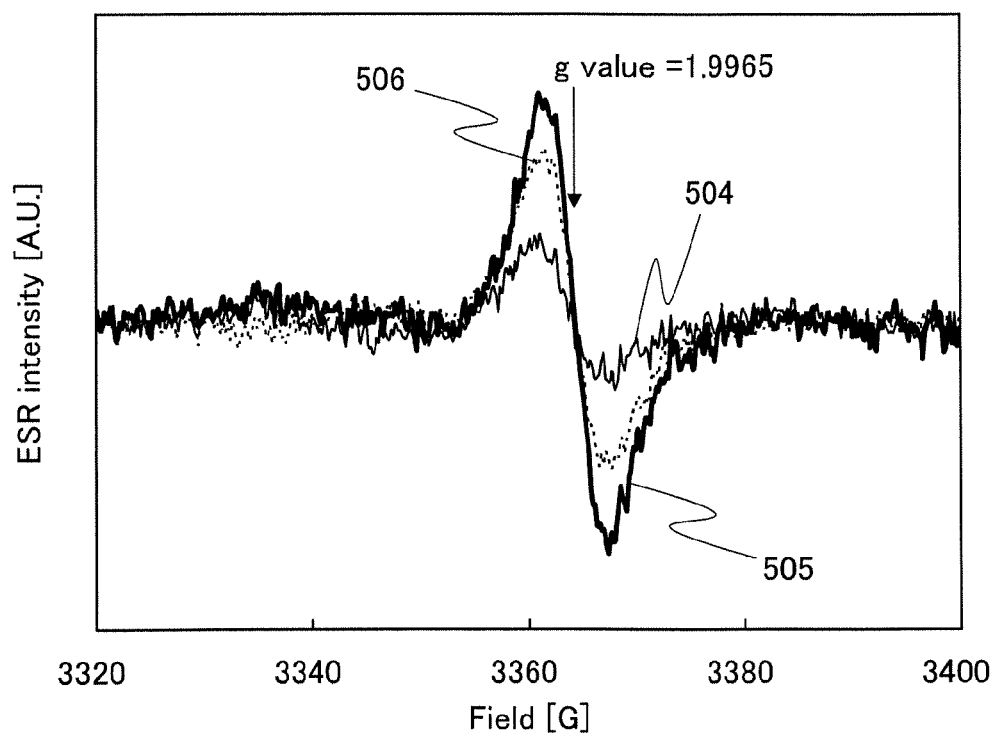
FIGS. 18A and 18B show ESR measurement results.
Figure 18B:
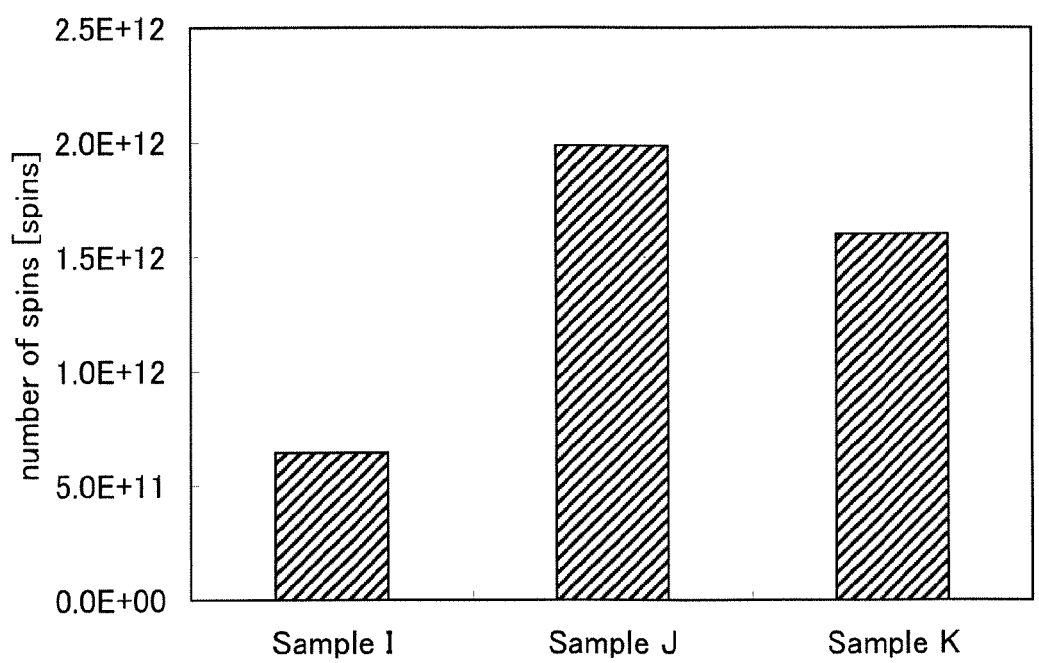

Measurement results of Samples I to K are shown in FIGS. 18A and 18B. A curve 504, a curve 505, and a curve 506 are a first derivative curve of Sample I, that of Sample J, and that of Sample K, respectively. Note that each of the curves 504 to 506 was obtained after subtracting a first derivative curve of measurement of unpaired electrons in the silicon nitride film as a background. Note that a sample including the first electrode, a silicon nitride film, and the second electrode was subjected to the negative gate BT test but change in an ESR signal was not observed.

As shown in FIG. 18A, a signal whose g value was 1.9965 was obtained in the curves 504 to 506. Further, the intensity of the signal whose g value was 1.9965 is higher in the curve 505 than in the curve 504; thus, it can be seen that the amount of unpaired electrons increased in Sample J by the negative gate BT test. Moreover, the intensity of the signal whose g value was 1.9965 is lower in the curve 506 than in the curve 505; thus, it can be seen that the amount of unpaired electrons decreased in Sample K by the heating at 85° C. for 48 hours.

The number of spins of each of Samples I to K when the g value was 1.9965, which was calculated from an integral value of the curve in FIG. 18A is shown in FIG. 18B. It can be seen that the number of spins in Sample J was larger than that in Sample I, and the number of spins in Sample K was smaller than that in Sample J.

Further, a g value reflects a state of an electron orbit of an unpaired electron. From the curves 501 to 506 in FIG. 17A and FIG. 18A, each of which has the signal whose g value was 1.9965, it is estimated that the unpaired electrons contained in Samples F to H are the same as the unpaired electrons which were generated as a result of the negative gate BT test.

Next, a bond defect whose g value belongs to near 1.9965 in an ESR spectrum observed in ESR measurement of the microcrystalline silicon film was verified by quantum chemistry calculation.

An ESR signal whose g value is near 1.9965 is observed with a deposition condition where nitrogen can be mixed into microcrystalline silicon. In this example, attention was focused on influence of nitrogen on a bond defect, and a cluster model including a silicon atom and a nitrogen atom and including a bond defect was formed. Note that bond defects except for one bond defect were terminated with hydrogen atoms. In the calculation, structure optimization was performed and a g value was then calculated by a gauge-independent atomic orbital (GIAO) method.

The density functional theory (DFT) using Gaussian basis was employed for structure optimization calculation. Also in the DFT, an exchange-correlation interaction is approximated by a functional (that is, a function of another function) of one electron potential represented in terms of electron density to enable high-speed calculations. Here, B3LYP which was a hybrid functional was used to specify the weight of each parameter related to exchange-correlation energy. In addition, as a basis function, 6-311G (a basis function of a triple-split valence basis set using three contraction functions for each valence orbital) was applied to all the atoms. By the above basis function, for example, orbitals of is to 3s are considered in the case of hydrogen atoms while orbitals of 1s to 4s and 2p to 4p are considered in the case of nitrogen atoms. Furthermore, to improve calculation accuracy, the p function and the d function as polarization basis sets were added respectively to hydrogen atoms and atoms other than hydrogen atoms.

For the calculation of g values, a gauge-independent atomic orbital (GIAO) method was employed as a method for calculation of a magnetic shield constant of a molecule. A Hartree-Fock (HF) method was employed in calculation of electron state by a GIAO method. The same conditions as the structure optimization calculation were applied as a basis function.

Note that Gaussian 09 was used as a quantum chemistry computational program. A high performance computer (Altix 4700, manufactured by SGI Japan, Ltd.) was used for the calculations.

Figures 19A, 19C, 19E:
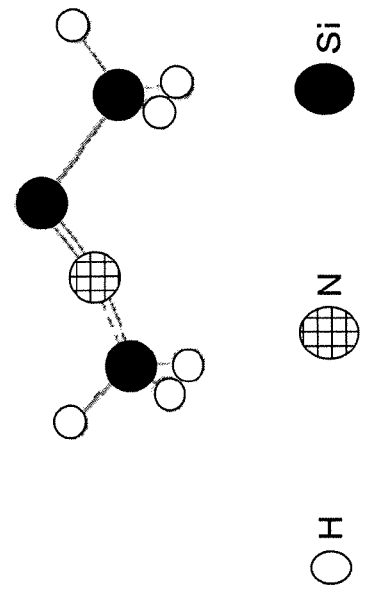
FIGS. 19A to 19F show schematic diagrams of bond defects.
Figures 19B, 19D, 19F:
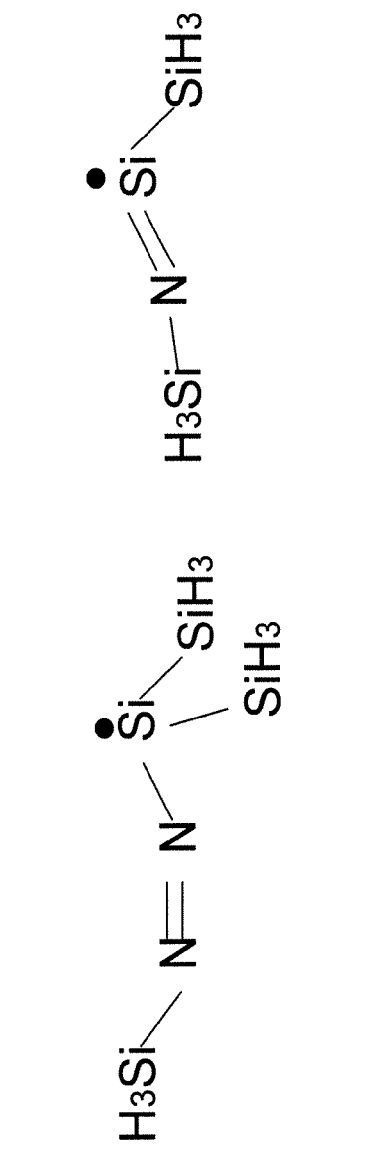

FIGS. 19A to 19F are schematic diagrams of bond defects of the cluster models used in the calculation, which can be seen as a cause of the g value of 1.9965. FIGS. 19A and 19B are schematic diagrams of bond defects of a structure A; FIGS. 19C and 19D are schematic diagrams of bond defects of a structure B; and FIGS. 19E and 19F are schematic diagrams of bond defects of a structure C. In the structure A, one of doubly bonded nitrogen atoms has a defect. Moreover, a silyl group is bonded to the other of the doubly bonded nitrogen atoms. In the structure B, a silicon atom which is bonded to one of doubly bonded nitrogen atoms has a defect. Moreover, two silyl groups are bonded to the silicon atom having the defect. Further, a silyl group is bonded to the other of the doubly bonded nitrogen atoms. In the structure C, a silicon atom which is doubly bonded to a nitrogen atom has a defect. Further, a silyl group is bonded to the silicon atom. Moreover, a silyl group is bonded to the nitrogen to which the silicon atom is doubly bonded.

Average g values which were calculated with the above-described structures are shown in Table 1.

TABLE 1

|         | A      | B      | C      |
|---------|--------|--------|--------|
| g value | 1.9977 | 2.0002 | 2.0004 |

Note that with the structure A, one of the doubly bonded nitrogen atoms had the defect and the silicon atom was bonded to the other of the doubly bonded nitrogen atoms, so that the g value became the value in Table 1. With the structure B, the silicon atom bonded to one of the doubly bonded nitrogen atoms had the defect, so that the g value became the value in Table 1. With the structure C, the silicon atom doubly bonded to the nitrogen atom had the defect, so that the g value became the value in Table 1.

From the calculation results, it was found that a bond defect of a structure in which nitrogen atoms are doubly bonded or a silicon atom and a nitrogen atom are doubly bonded to each other tends to make the g value close to 1.9965.

Thus, the following was indicated. In the case where a microcrystalline silicon film is deposited in a process chamber filled with an atmosphere containing nitrogen atoms, a structure may be formed in which a double bond is formed between atoms, depending on a condition. When the structure has a bond defect, an ESR signal whose g value is 1.9965 may be observed.

Due to a gate BT test, a hydrogen atom becomes easy to be detached from doubly bonded nitrogen atoms or a silicon atom bonded to doubly bonded nitrogen atoms; as a result of the detachment, an unpaired electron is formed. Such an unpaired electron can be seen as a cause of a reduction in the reliability of a thin film transistor. Thus, by reducing the nitrogen concentration in a microcrystalline silicon film, the reliability of a thin film transistor can be increased.

This application is based on Japanese Patent Application serial no. 2010-205992 filed with Japan Patent Office on Sep. 14, 2010, the entire contents of which are hereby incorporated by reference.

What is claimed is:

1. A thin film transistor comprising:
a gate electrode;
a gate insulating film in contact with the gate electrode;
a semiconductor film over the gate insulating film;
a pair of impurity semiconductor films over the semiconductor film;
a wiring over the pair of impurity semiconductor films; and
an insulating film over the gate insulating film, the semiconductor film, the pair of impurity semiconductor films, and the wiring,
wherein the semiconductor film comprises a microcrystalline semiconductor region positioned on a gate insulating film side and a pair of amorphous semiconductor regions in contact with part of the microcrystalline semiconductor region, and wherein, in the microcrystalline semiconductor region, a nitrogen concentration in an interface with the gate insulating film and a nitrogen concentration in an interface with the insulating film are lower than a nitrogen concentration in an interface with the pair of amorphous semiconductor regions.

2. The thin film transistor according to claim 1, wherein a nitrogen concentration on the gate insulating film side in the microcrystalline semiconductor region is higher than or equal to a minimum limit of detection and lower than or equal to $1 \times 10^{19}$ atoms/cm$^3$.

3. The thin film transistor according to claim 1, wherein a nitrogen concentration on a pair of amorphous semiconductor regions side in the microcrystalline semiconductor region is higher than or equal to $1 \times 10^{20}$ atoms/cm$^3$ and lower than or equal to $1 \times 10^{21}$ atoms/cm$^3$.

4. The thin film transistor according to claim 1, further comprising a back gate electrode overlapping with a region of the microcrystalline semiconductor region, which is over the insulating film and does not overlap with the wiring.

5. The thin film transistor according to claim 1, wherein the microcrystalline semiconductor region has a sharp projection at an interface between the pair of amorphous semiconductor regions.

6. The thin film transistor according to claim 1, wherein an interface between the insulating film and the microcrystalline semiconductor region is flat.

7. The thin film transistor according to claim 1,
wherein the gate insulating film has a stacked-layer structure of a nitride insulating film and an oxide insulating film, and
wherein the oxide insulating film is positioned on a microcrystalline semiconductor region side.

8. The thin film transistor according to claim 1,
wherein the insulating film has a stacked-layer structure of a nitride insulating film and an oxide insulating film, and
wherein the oxide insulating film is positioned on a microcrystalline semiconductor region side.

9. A thin film transistor comprising:
a gate electrode;
a gate insulating film in contact with the gate electrode;
a semiconductor film over the gate insulating film;
a pair of impurity semiconductor films over the semiconductor film;
a wiring over the pair of impurity semiconductor films; and
an insulating film over the gate insulating film, the semiconductor film, the pair of impurity semiconductor films, and the wiring,
wherein the semiconductor film comprises a microcrystalline semiconductor region positioned on a gate insulating film side and a pair of amorphous semiconductor regions in contact with part of the microcrystalline semiconductor region,
wherein a nitrogen concentration profile by secondary ion mass spectrometry in the microcrystalline semiconductor region in contact with the pair of amorphous semiconductor regions marks a peak concentration on an amorphous semiconductor region side, and
wherein a nitrogen concentration profile by secondary ion mass spectrometry in the microcrystalline semiconductor region in contact with the insulating film marks no peak concentration.

10. The thin film transistor according to claim 9, wherein a nitrogen concentration on the gate insulating film side in the microcrystalline semiconductor region is higher than or equal to a minimum limit of detection and lower than or equal to $1 \times 10^{19}$ atoms/cm$^3$.

11. The thin film transistor according to claim 9, wherein a nitrogen concentration on a pair of amorphous semiconductor regions side in the microcrystalline semiconductor region is higher than or equal to $1 \times 10^{20}$ atoms/cm$^3$ and lower than or equal to $1 \times 10^{21}$ atoms/cm$^3$.

12. The thin film transistor according to claim 9, further comprising a back gate electrode overlapping with a region of the microcrystalline semiconductor region, which is over the insulating film and does not overlap with the wiring.

13. The thin film transistor according to claim 9, wherein the microcrystalline semiconductor region has a sharp projection at an interface between the pair of amorphous semiconductor regions.

14. The thin film transistor according to claim 9, wherein an interface between the insulating film and the microcrystalline semiconductor region is flat.

15. The thin film transistor according to claim 9,
wherein the gate insulating film has a stacked-layer structure of a nitride insulating film and an oxide insulating film, and
wherein the oxide insulating film is positioned on a microcrystalline semiconductor region side.

16. The thin film transistor according to claim 9,
wherein the insulating film has a stacked-layer structure of a nitride insulating film and an oxide insulating film, and
wherein the oxide insulating film is positioned on a microcrystalline semiconductor region side.

17. A thin film transistor comprising:
a gate electrode;
a gate insulating film in contact with the gate electrode;
a semiconductor film over the gate insulating film;
a pair of impurity semiconductor films over the semiconductor film;
a wiring over the pair of impurity semiconductor films; and
an insulating film over the gate insulating film, the semiconductor film, the pair of impurity semiconductor films, and the wiring,
wherein the semiconductor film comprises a microcrystalline semiconductor region positioned on a gate insulating film side and a pair of amorphous semiconductor regions in contact with part of the microcrystalline semiconductor region,
wherein a nitrogen concentration profile by secondary ion mass spectrometry in the microcrystalline semiconductor region in contact with the pair of amorphous semiconductor regions increases from the gate insulating film side toward an amorphous semiconductor region side, and has a maximum value in the part of the microcrystalline semiconductor region and the pair of amorphous semiconductor regions, and
wherein a nitrogen concentration profile by secondary ion mass spectrometry in the microcrystalline semiconductor region in contact with the insulating film marks no peak concentration.

18. The thin film transistor according to claim 17, wherein a nitrogen concentration on the gate insulating film side in the microcrystalline semiconductor region is higher than or equal to a minimum limit of detection and lower than or equal to $1 \times 10^{19}$ atoms/cm$^3$.

19. The thin film transistor according to claim 17, wherein a nitrogen concentration on a pair of amorphous semiconductor regions side in the microcrystalline semiconductor region is higher than or equal to $1 \times 10^{20}$ atoms/cm$^3$ and lower than or equal to $1 \times 10^{21}$ atoms/cm$^3$.

20. The thin film transistor according to claim 17, further comprising a back gate electrode overlapping with a region of the microcrystalline semiconductor region, which is over the insulating film and does not overlap with the wiring.

21. The thin film transistor according to claim 17, wherein the microcrystalline semiconductor region has a sharp projection at an interface between the pair of amorphous semiconductor regions.

22. The thin film transistor according to claim 17, wherein an interface between the insulating film and the microcrystalline semiconductor region is flat.

23. The thin film transistor according to claim 17,
   wherein the gate insulating film has a stacked-layer structure of a nitride insulating film and an oxide insulating film, and
   wherein the oxide insulating film is positioned on a microcrystalline semiconductor region side.

24. The thin film transistor according to claim 17,
   wherein the insulating film has a stacked-layer structure of a nitride insulating film and an oxide insulating film, and
   wherein the oxide insulating film is positioned on a microcrystalline semiconductor region side.

\* \* \* \* \*